(12) United States Patent
Ikebe et al.

(10) Patent No.: US 10,578,961 B2
(45) Date of Patent: *Mar. 3, 2020

(54) MASK BLANK SUBSTRATE, MULTI-LAYER REFLECTIVE FILM COATED SUBSTRATE, AND MASK BLANK

(71) Applicant: HOYA CORPORATION, Shinjuku-ku (JP)

(72) Inventors: Yohei Ikebe, Shinjuku-ku (JP); Masaru Tanabe, Shinjuku-ku (JP)

(73) Assignee: HOYA CORPORATION, Tokyo (JP)

( * ) Notice: Subject to any disclaimer, the term of this patent is extended or adjusted under 35 U.S.C. 154(b) by 43 days.

This patent is subject to a terminal disclaimer.

(21) Appl. No.: 15/676,032

(22) Filed: Aug. 14, 2017

(65) Prior Publication Data

US 2018/0157166 A1  Jun. 7, 2018

Related U.S. Application Data

(63) Continuation of application No. 15/533,496, filed as application No. PCT/JP2015/080088 on Oct. 26, 2015, now abandoned.

(30) Foreign Application Priority Data

Dec. 19, 2014  (JP) ................................. 2014-257187

(51) Int. Cl.
*G03F 1/60* (2012.01)
*G03F 1/22* (2012.01)
(Continued)

(52) U.S. Cl.
CPC ................ *G03F 1/60* (2013.01); *C03C 17/36* (2013.01); *C03C 17/3602* (2013.01);
(Continued)

(58) Field of Classification Search
CPC . C03C 17/36; C03C 17/3636; C03C 17/3649; C03C 17/3657; C03C 17/3602;
(Continued)

(56) References Cited

U.S. PATENT DOCUMENTS 9,690,189 B2 * 6/2017 Tanabe ..................... G03F 1/60
2002/0155361 A1 10/2002 Takeuchi et al.
(Continued)

FOREIGN PATENT DOCUMENTS

JP       S6440267 A    2/1989
JP       2002318450 A  10/2002
(Continued)

OTHER PUBLICATIONS

U.S. Appl. No. 15/533,496, filed Oct. 26, 2015, Yohei Ikebe.
(Continued)

*Primary Examiner* — Martin J Angebranndt
(74) *Attorney, Agent, or Firm* — Kilpatrick Townsend & Stockton LLP

(57) ABSTRACT

The object is to provide a mask blank substrate, a mask blank, and a transfer mask which can achieve easy correction of a wavefront by a wavefront correction function of an exposure apparatus. The further object is to provide methods for manufacturing them.
A virtual surface shape, which is an optically effective flat reference surface shape defined by a Zernike polynomial, is determined, wherein the Zernike polynomial is composed of only terms in which the order of variables related to a radius is second or lower order and includes one or more terms in which the order of the variables related to a radius is second-order; and the mask blank substrate, in which difference data (PV value) between the maximum value and the minimum value of difference shape between a virtual surface shape and a composite surface shape obtained by composing respective surface shapes of two main surfaces is 25 nm or less, is selected.

19 Claims, 6 Drawing Sheets

(51) Int. Cl.
*G03F 1/24* (2012.01)
*H01L 21/033* (2006.01)
*C03C 17/36* (2006.01)
*G03F 7/20* (2006.01)
*G03F 1/66* (2012.01)

(52) U.S. Cl.
CPC ...... *C03C 17/3636* (2013.01); *C03C 17/3649* (2013.01); *C03C 17/3657* (2013.01); *G03F 1/22* (2013.01); *G03F 1/24* (2013.01); *H01L 21/0332* (2013.01); *H01L 21/0335* (2013.01); *H01L 21/0337* (2013.01); *H01L 21/0338* (2013.01); *C03C 2217/254* (2013.01); *C03C 2217/26* (2013.01); *C03C 2217/28* (2013.01); *C03C 2217/734* (2013.01); *C03C 2218/156* (2013.01)

(58) Field of Classification Search
CPC .......... C03C 2217/28; C03C 2217/734; C03C 17/26; C03C 17/254; C03C 2218/156; G03F 1/60; G03F 1/24; G03F 1/22; H01L 21/0335; H01L 21/0332; H01L 21/0338; H01L 21/0337
See application file for complete search history.

(56) References Cited

U.S. PATENT DOCUMENTS

| | | | |
|---|---|---|---|
| 2003/0031890 A1* | 2/2003 | Moriya | G03F 1/60 428/620 |
| 2004/0013956 A1 | 1/2004 | Sogard | |
| 2004/0137677 A1 | 7/2004 | Lowisch et al. | |
| 2004/0227916 A1 | 11/2004 | Kono et al. | |
| 2006/0068301 A1 | 3/2006 | Hirukawa | |
| 2007/0134556 A1* | 6/2007 | Sano | H01M 2/16 429/247 |
| 2007/0134566 A1* | 6/2007 | Maida | B82Y 10/00 430/5 |
| 2008/0024874 A1 | 1/2008 | Uitterdijk et al. | |
| 2008/0212183 A1 | 9/2008 | Uitterdijk et al. | |
| 2010/0028787 A1* | 2/2010 | Koike | B82Y 10/00 430/5 |
| 2011/0171568 A1* | 7/2011 | Sasaki | B24B 1/005 430/5 |
| 2011/0287219 A1* | 11/2011 | Matsui | B82Y 10/00 428/141 |
| 2012/0258389 A1* | 10/2012 | Maida | C03B 19/1415 430/5 |
| 2013/0010272 A1 | 1/2013 | Gyoda et al. | |
| 2013/0022900 A1 | 1/2013 | Tanabe | |
| 2014/0329174 A1* | 11/2014 | Hamamoto | G03F 1/22 430/5 |
| 2015/0017574 A1* | 1/2015 | Orihara | G03F 1/22 430/5 |
| 2016/0109797 A1 | 4/2016 | Tanabe | |
| 2016/0168020 A1* | 6/2016 | Okamura | C03C 15/025 428/141 |
| 2017/0363952 A1* | 12/2017 | Ikebe | C03C 17/36 |

FOREIGN PATENT DOCUMENTS

| | | | | |
|---|---|---|---|---|
| JP | 2004031954 A | | 1/2004 | |
| JP | 2004179663 A | | 6/2004 | |
| JP | 2004296939 A | | 10/2004 | |
| JP | 2006133629 A | | 5/2006 | |
| JP | 2008028388 A | | 2/2008 | |
| JP | 2013016710 A | | 1/2013 | |
| JP | 2014-150124 | * | 8/2014 | ............... G03F 1/24 |
| JP | 2014-199847 | * | 10/2014 | ............... G03F 1/24 |
| WO | WO-2004/099874 A1 | | 11/2004 | |
| WO | WO-2011/122608 A1 | | 10/2011 | |
| WO | WO-2012/102313 A1 | | 8/2012 | |
| WO | 2013/146991 | * | 10/2013 | ............... G03F 1/22 |
| WO | WO-2014/203961 A1 | | 12/2014 | |
| WO | WO-2016/098452 A1 | | 6/2016 | |

OTHER PUBLICATIONS

PCT, PCT/JP2015/080088 (WO 2016/098452), Oct. 26, 2015, Jun. 23, 2016, Hoya Corporation.
International Search Report and Written Opinion dated Jan. 19, 2016 by the International Searching Authority for International Application No. PCT/JP2015/080088, which was filed on Oct. 26, 2015 and published as WO 2016/098452 on Jun. 23, 2016 (Applicant—Hoya Corporation; Inventor—Ikebe, et al.)(Original—7 pages// Translated—2 pages).
Preliminary Amendment dated Jun. 7, 2017 by the USPTO for U.S. Appl. No. 15/533,496, which was filed on Jun. 6, 2017(Applicant—Hoya Corporation; Inventor—Ikebe, et al.) (Original—16 pages).

* cited by examiner

MASK BLANK SUBSTRATE, MULTI-LAYER REFLECTIVE FILM COATED SUBSTRATE, AND MASK BLANK

CROSS-REFERENCE TO RELATED APPLICATION

This application is a continuation of U.S. Utility application Ser. No. 15/533,496, filed Jun. 6, 2017, which is a U.S. National Phase Application of International Application No. PCT/JP2015/08008, filed Oct. 26, 2015, which claims priority to Japanese Patent Application No. 2014-257186, filed Dec. 19, 2014. The contents of these earlier filed applications are hereby incorporated by reference herein in their entirety.

TECHNICAL FIELD

The present disclosure relates to a mask blank substrate, a mask blank, and a transfer mask used in photolithography, methods for manufacturing them, and a method for manufacturing a semiconductor device. In particular, the present disclosure relates to a mask blank substrate suitable for a transfer mask involved in photolithography which utilizes extreme ultra violet (EUV) light as exposure light.

BACKGROUND ART

Mask blanks used in the semiconductor design rule 1× generation (half-pitch (hp) 14 nm, 10 nm, etc.) include a reflective mask blank for EUV exposure, a binary mask blank for ArF excimer laser exposure, and a phase shift mask blank.

High flatness is required for a main surface of a mask blank substrate (that is, a surface on which a transfer pattern is to be formed) used to manufacture the reflective mask blank for EUV exposure used in the semiconductor design rule 1× generation. In order to meet the requirement for flatness, double-sided polishing for polishing both the front and back surfaces of the mask blank substrate using a polishing pad such as a polishing cloth and a polishing solution containing polishing abrasive grains has been employed often, as disclosed in, e.g., Patent Document 1. However, regarding the polishing of the transparent substrate by a conventional double-side polishing device, there is a limitation in increasing flatness of the main surface. Thus, the technique for flattening the main surface by measuring a shape of the main surface of the substrate and applying the plasma etching on a relatively convex portion has been developed, as shown in Patent Document 2.

Regarding exposure apparatuses having ArF excimer lasers as light sources, the numerical aperture (NA) has been increased, and the focus tolerance in the lithography step has been decreased. This has given rise to a problem of a profound effect on transfer accuracy from a wavefront aberration of a projection optical system. As measures to solve this problem, Patent Document 3 applies a correction optical element to a projection optical system for reducing the wavefront aberration. This correction optical element has a surface shape which can be defined by a Zernike polynomial for correcting an aberration resulting from a lens heating effect of the projection optical system. On the other hand, in EUV lithography comprised of an optical system comprised of a plurality of mirrors, the wavefront correction by controlling a deformable mirror has been considered, as disclosed in Patent Document 4.

As discussed below, Patent Document 5 discloses a device which can measure both the surface shape and the distribution of thickness variation for both the front and back main surfaces of the substrate.

PRIOR ART DOCUMENTS

Patent Documents

Patent Document 1: Japanese Patent Application Publication 1-40267
Patent Document 2: Japanese Patent Application Publication 2002-318450
Patent Document 3: Japanese Patent Application Publication 2008-028388
Patent Document 4: Japanese Patent Application Publication 2004-031954
Patent Document 5: Japanese Patent Application Publication 2006-133629

SUMMARY

As described above, high flatness is required for the main surface of the mask blank substrate. By applying various local processing techniques including the technique disclosed in Patent Document 2, a certain level of requirement for the main surface flatness can be satisfied. However, it is not easy to process the main surface to have higher flatness exceeding such a level. Further, in the case of a reflective mask (transfer mask), when it is placed in the exposure apparatus for exposure transfer to a transfer target object (a resist film on a wafer), the main surface (back main surface) of the reflective mask opposite to the main surface (front main surface) provided with a thin film having a transfer pattern is almost entirely chucked to a mask stage of the exposure apparatus.

Generally, the reflective mask is held on the mask stage through electrostatic chucking. A thin film having conductivity is provided on the back main surface of the reflective mask, and an almost entire surface of the thin film is electrostatically chucked to the mask stage. That is, the entire back main surface is chucked via the thin film, and the back main surface is corrected to be flatter during electrostatic chucking of the reflective mask. Generally, it is difficult to make the substrate main surface completely flat. Since the back main surface of the reflective mask is not completely flat, when the back main surface is corrected to be completely flat upon the electrostatic chucking, the front main surface is also strongly affected, thereby inevitably changing its shape.

Based on the above technical background, embodiments include a substrate used for the reflective mask (reflective mask blank) with high flatness in both the front main surface and the back main surface. Further, it also includes a variation in distance between the front main surface and the back main surface, a so-called thickness variation, is small in the substrate. In general, it is difficult for both the front and back main surfaces to simultaneously satisfy the flatness required for the reflective mask only by double-sided polishing of the front and back main surfaces of the substrate with the double-side polishing device. Thus, the flatness of the main surface has been increased by locally processing a relatively convex portion in the substrate main surface using the above technique as in Patent Document 2.

However, in general, any local processing technique cannot locally process both the front and back main surfaces simultaneously, and thus, the respective main surfaces are separately subjected to the local processing. Therefore, while the local processing can increase the flatness of each of the front and back main surfaces, it cannot easily provide a lower level of thickness variation.

There is an apparatus which can measure both the surface shapes and thickness variation distribution of the front and back main surfaces of the substrate, as disclosed in Patent Document 5. Since low thermal expansivity is required for the substrate in the reflective mask, multi-component glass such as SiO2-TiO2 glass is used principally. The measuring apparatus in Patent Document 5 has to transmit measuring light through the substrate that is a measuring object. However, the multi-component glass has a variation in internal composition distribution and an internal fluctuation greater than the synthetic quartz glass, and easily affects a wavefront of transmitted measuring light. Thus, there is a problem that the measurement by this measuring apparatus often causes errors in measured results of the thickness variation and errors in the surface shapes of the main surfaces. On the other hand, if the surface shapes of the two main surfaces of the substrate are individually measured, the measurement accuracy is higher than the measurement by the measuring apparatus of Patent Document 5.

The disclosure includes a mask blank substrate, which can achieve the high transfer accuracy when a reflective mask manufactured using the substrate is chucked to an exposure apparatus for exposure transfer even if both front and back main surfaces of the substrate have been subjected to conventional double-sided polishing and local processing. The embodiment also provide a mask blank or a transfer mask manufactured using the mask blank substrate, and provide methods for manufacturing them. Further, the embodiments include manufacturing a semiconductor device in which the high transfer accuracy is ensured and a circuit operation is stable through the use of the transfer mask.

Embodiments

The inventor made a study of the following matters in order to solve the above problems.

As described above, it is difficult to measure the thickness variation of the substrate with high accuracy. Even if the front and back main surfaces of the substrate are locally processed respectively to increase the flatness of each main surface, the in-plane distribution of thickness variation will be improved only to a limited degree. As above, when the reflective mask is electrostatically chucked to the mask stage of the exposure apparatus, the back main surface of the substrate is corrected to be completely flat. Due to this, the thickness variation of the substrate is strongly reflected in the surface shape of the front main surface. That is, when the reflective mask is being electrostatically chucked to the mask stage of the exposure apparatus, the surface shape of the front main surface of the substrate would be equivalent to the height distribution corresponding to the in-plane distribution of thickness variation.

The inventor focused on a wavefront correction function possessed by the exposure apparatus electrostatically chucking the reflective mask. The reflective mask includes a multi-layer reflective film on the entire front main surface of the substrate, and an absorber film having a transfer pattern on the multi-layer reflective film. The reflective mask may include another film such as a base film between the substrate and the multi-layer reflective film, or a protective film on the multi-layer reflective film surface. In any reflective mask, the EUV light as the exposure light is reflected by the multi-layer reflective film. The wavefront correction function of the exposure apparatus will conduct the wavefront correction on the exposure light reflected by the multi-layer reflective film. Generally, the multi-layer reflective film has high in-plane uniformity, and the surface shape of the front main surface of the substrate when electrostatically chucked to the mask stage is substantially reflected in the surface shape of the multi-layer reflective film.

The inventor thought that the wavefront correction function of the exposure apparatus using the EUV light as the exposure light could also correct components of the surface shape definable by a Zernike polynomial. Then, the inventor found that if the surface shape of the front main surface of the substrate when electrostatically chucked to the mask stage is close to the shape (virtual surface shape) definable by a Zernike polynomial and correctable with the wavefront correction function, the effect obtained is similar to the effect created by the substrate with significantly improved thickness variation. That is, the inventor thought of using, as the mask blank substrate, a substrate which had a small amount of fitting deviation when fitting the shape defined by a Zernike polynomial to the surface shape of the front main surface of the substrate during the electrostatically chucking to the mask stage.

The inventor further found that while the wavefront correction function of the exposure apparatus can also operate when the order of terms in a Zernike polynomial is high, such as third or higher order, the wavefront correction by applying even the high-order term to deviation of an equivalent wavefront of the reflected light due to the reflective mask may cause the high-order aberration of a reflective mirror of a projection optical system to change depending on the exposure conditions, which may be disadvantageous. That is, the inventor was concerned that there is an effect on the original role of the wavefront correction function afforded to the exposure apparatus (e.g., a role in correcting a deviation of the equivalent wavefront resulting from a lack in accuracy, etc. in an illumination system or a projection optical system of the exposure apparatus, etc.) if the virtual surface shape definable by a Zernike polynomial to be fitted to the substrate is a curved shape using even a high-order term. Furthermore, the inventor found that the Zernike polynomial including only the first-order terms leads to a one-dimensional tilt correction, by which a sufficient corrective effect cannot be obtained. In view of these points, the inventor found that it is effective that the Zernike polynomial defining the virtual surface shape is composed of only terms in which the order of variables is second or lower order and includes one or more terms in which the order of the variables is second-order.

In this way, the present disclosure was made as a result of earnest study as above, and includes the following configurations.

(Configuration 1)

A mask blank substrate comprising a substrate having two opposite main surfaces, wherein when the shape fitting between a virtual surface shape and a composite surface shape obtained by composing respective surface shapes of the two main surfaces is performed in a calculation region inside a circle 104 mm in diameter based on the center of the substrate to obtain differential data, a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 2)

The mask blank substrate according to Configuration 1, wherein the composite surface shape is obtained by adding together a surface shape of one of the main surfaces that is an in-plane distribution of height from a reference surface acting as a reference for the surface shape of the one main surface to the one main surface, and a surface shape of the other main surface that is an in-plane distribution of height from a reference surface acting as a reference for the surface shape of the other main surface to the other main surface.

(Configuration 3)

The mask blank substrate according to Configuration 1 or 2, wherein the composite surface shape has a difference of 90 nm or less between the maximum height and the minimum height in an inner region of a square shape having a side of 132 mm based on the center of the substrate.

(Configuration 4)

A multi-layer reflective film coated substrate, comprising a multi-layer reflective film provided on the one main surface of the mask blank substrate according to any one of Configurations 1 to 3.

(Configuration 5)

A multi-layer reflective film coated substrate comprising a multi-layer reflective film on one of two opposite main surfaces of a substrate and a conductive film on the other main surface, wherein when the shape fitting between a virtual surface shape and a composite surface shape obtained by composing a surface shape of the multi-layer reflective film and a surface shape of the conductive film is performed in a calculation region inside a circle 104 mm in diameter based on the center of the substrate to obtain differential data, a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 6)

The multi-layer reflective film coated substrate according to Configuration 5, wherein the composite surface shape is obtained by adding together the surface shape of the multi-layer reflective film that is an in-plane distribution of height from a reference surface acting as a reference for the surface shape of the multi-layer reflective film to a surface of the multi-layer reflective film, and the surface shape of the conductive film that is an in-plane distribution of height from a reference surface acting as a reference for the surface shape of the conductive film to a surface of the conductive film.

(Configuration 7)

The multi-layer reflective film coated substrate according to Configuration 5 or 6, wherein the composite surface shape has a difference of 90 nm or less between the maximum height and the minimum height in an inner region of a square shape having a side of 132 mm based on the center of the substrate.

(Configuration 8)

A mask blank, comprising a thin film for transfer pattern formation provided on the one main surface of the mask blank substrate according to any one of Configurations 1 to 3.

(Configuration 9)

A mask blank, comprising a thin film for transfer pattern formation provided on the multi-layer reflective film of the multi-layer reflective film coated substrate according to any one of Configurations 4 to 7.

(Configuration 10)

A mask blank comprising a thin film for transfer pattern formation on one of two opposite main surfaces of a substrate, wherein when the shape fitting between a virtual surface shape and a composite surface shape obtained by composing a surface shape of the thin film and a surface shape of the other main surface is performed in a calculation region inside a circle 104 mm in diameter based on the center of the substrate to obtain differential data, a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 11)

The mask blank according to Configuration 10, wherein the composite surface shape is obtained by adding together the surface shape of the thin film that is an in-plane distribution of height from a reference surface acting as a reference for the surface shape of the thin film to a surface of the thin film, and the surface shape of the other main surface that is an in-plane distribution of height from a reference surface acting as a reference for the surface shape of the other main surface to the other main surface.

(Configuration 12)

The mask blank according to Configuration 10 or 11, wherein the composite surface shape has a difference of 90 nm or less between the maximum height and the minimum height in an inner region of a square shape having a side of 132 mm based on the center of the substrate.

(Configuration 13)

A mask blank comprising a thin film for transfer pattern formation on one of two opposite main surfaces of a substrate and a conductive film on the other main surface, wherein when the shape fitting between a virtual surface shape and a composite surface shape obtained by composing a surface shape of the thin film and a surface shape of the conductive film is performed in a calculation region inside a circle 104 mm in diameter based on the center of the substrate to obtain differential data, a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 14)

The mask blank according to Configuration 13, wherein the composite surface shape is obtained by adding together the surface shape of the thin film that is an in-plane distribution of height from a reference surface acting as a reference for the surface shape of the thin film to a surface of the thin film, and the surface shape of the conductive film that is an in-plane distribution of height from a reference surface acting as a reference for the surface shape of the conductive film to a surface of the conductive film.

(Configuration 15)

The mask blank according to Configuration 13 or 14, wherein the composite surface shape has a difference of 90 nm or less between the maximum height and the minimum height in an inner region of a square shape having a side of 132 mm based on the center of the substrate.

(Configuration 16)

The mask blank according to any one of Configurations 13 to 15, wherein a multi-layer reflective film is provided between the one main surface and the thin film.

(Configuration 17)

A method of manufacturing a transfer mask comprising the forming a transfer pattern in the thin film of the mask blank according to any one of Configurations 8 to 16.

(Configuration 18)

A method of manufacturing a mask blank substrate comprising a substrate having two opposite main surfaces, comprising:

performing the shape fitting between a virtual surface shape and a composite surface shape obtained by composing respective surface shapes of the two main surfaces in a calculation region inside a circle 104 mm in diameter based on the center of the substrate to obtain differential data; and selecting, as a mask blank substrate, the substrate in which a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 19)

The method of manufacturing a mask blank substrate according to Configuration 18, wherein the composite surface shape is obtained by adding together the surface shape of one of the main surfaces that is an in-plane distribution of height from a reference surface acting as a reference for the surface shape of the one main surface to the one main surface, and the surface shape of the other main surface that is an in-plane distribution of height from a reference surface acting as a reference for the surface shape of the other main surface to the other main surface.

(Configuration 20)

The method of manufacturing a mask blank substrate according to Configuration 18 or 19, wherein the method further comprises selecting a substrate in which the composite surface shape has a difference of 90 nm or less between the maximum height and the minimum height in an inner region of a square shape having a side of 132 mm based on the center of the substrate.

(Configuration 21)

A method of manufacturing a multi-layer reflective film coated substrate comprising providing a multi-layer reflective film on one main surface of the mask blank substrate manufactured by the method for manufacturing a mask blank substrate according to any one of Configurations 18 to 20.

(Configuration 22)

A method of manufacturing a multi-layer reflective film coated substrate comprising a multi-layer reflective film on one of two opposite main surfaces of a substrate and a conductive film on the other main surface, comprising:

preparing the substrate comprising the multi-layer reflective film on the one main surface and the conductive film on the other main surface;

performing the shape fitting between a virtual surface shape and a composite surface shape obtained by composing a surface shape of the multi-layer reflective film and a surface shape of the conductive film in a calculation region inside a circle 104 mm in diameter based on the center of the substrate to obtain differential data; and selecting, as a multi-layer reflective film coated substrate, the substrate in which a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 23)

The method of manufacturing a multi-layer reflective film coated substrate according to Configuration 22, wherein the composite surface shape is obtained by adding together the surface shape of the multi-layer reflective film that is an in-plane distribution of height from a reference surface acting as a reference for the surface shape of the multi-layer reflective film to a surface of the multi-layer reflective film, and the surface shape of the conductive film that is an in-plane distribution of height from a reference surface acting as a reference for the surface shape of the conductive film to a surface of the conductive film.

(Configuration 24)

The method of manufacturing a multi-layer reflective film coated substrate according to Configuration 22 or 23, wherein the method further comprises selecting a substrate in which the composite surface shape has a difference of 90 nm or less between the maximum height and the minimum height in an inner region of a square shape having a side of 132 mm based on the center of the substrate.

(Configuration 25)

A method of manufacturing a mask blank comprising providing a thin film for transfer pattern formation on the one main surface of the mask blank substrate manufactured by the method for manufacturing a mask blank substrate according to any one of Configurations 18 to 20.

(Configuration 26)

A method of manufacturing a mask blank comprising providing a thin film for transfer pattern formation on the multi-layer reflective film of the multi-layer reflective film coated substrate manufactured by the method for manufacturing a multi-layer reflective film coated substrate according to any one of Configurations 21 to 24.

(Configuration 27)

A method of manufacturing a mask blank comprising a thin film for transfer pattern formation on one of two opposite main surfaces of a substrate, comprising:

preparing the substrate comprising the thin film for transfer pattern formation on the one main surface;

performing the shape fitting between a virtual surface shape and a composite surface shape obtained by composing a surface shape of the thin film and a surface shape of the other main surface in a calculation region inside a circle 104 mm in diameter based on the center of the substrate to obtain differential data; and selecting, as a mask blank, the substrate in which a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 28)

The method of manufacturing a mask blank according to Configuration 27, wherein the composite surface shape is obtained by adding together the surface shape of the thin film that is an in-plane distribution of height from a reference surface acting as a reference for the surface shape of the thin film to a surface of the thin film, and the surface shape of the other main surface that is an in-plane distribution of height from a reference surface acting as a reference for the surface shape of the other main surface to the other main surface.

(Configuration 29)

The method of manufacturing a mask blank according to Configuration 27 or 28, further comprising selecting a substrate in which the composite surface shape has a difference of 90 nm or less between the maximum height and the minimum height in an inner region of a square shape having a side of 132 mm based on the center of the substrate.

(Configuration 30)

A method of manufacturing a mask blank comprising a thin film for transfer pattern formation on one of two opposite main surfaces of a substrate and a conductive film on the other main surface, comprising:

preparing the substrate comprising the thin film for transfer pattern formation on the one main surface and the conductive film on the other main surface;

performing the shape fitting between a virtual surface shape and a composite surface shape obtained by composing a surface shape of the thin film and a surface shape of the conductive film in a calculation region inside a circle 104 mm in diameter based on the center of the substrate to obtain differential data; and selecting, as a mask blank, the substrate in which a difference between the maximum height and the minimum height within the calculation region in the differential data is 25 nm or less, wherein the virtual surface shape has a shape defined by a Zernike polynomial expressed in a polar coordinate system, and wherein the Zernike polynomial is composed of only terms in which the order of variables related to a radius is second or lower order and includes one or more terms in which the order of the variables related to a radius is second-order.

(Configuration 31)

The method of manufacturing a mask blank according to Configuration 30, wherein the composite surface shape is obtained by adding together the surface shape of the thin film that is an in-plane distribution of height from a reference surface acting as a reference for the surface shape of the thin film to a surface of the thin film, and the surface shape of the conductive film that is an in-plane distribution of height from a reference surface acting as a reference for the surface shape of the conductive film to a surface of the conductive film.

(Configuration 32)

The method of manufacturing a mask blank according to Configuration 30 or 31, further comprising the step of selecting a substrate in which the composite surface shape has a difference of 90 nm or less between the maximum height and the minimum height in an inner region of a square shape having a side of 132 mm based on the center of the substrate.

(Configuration 33)

The method of manufacturing a mask blank according to any one of Configurations 30 to 32, wherein a multi-layer reflective film is provided between the one main surface and the thin film.

(Configuration 34)

A method of manufacturing a transfer mask, comprising forming a transfer pattern in the thin film of the mask blank manufactured by the method for manufacturing a mask blank according to any one of Configurations 25 to 33.

(Configuration 35)

A method manufacturing a semiconductor device, comprising:

placing the transfer mask manufactured by the method for manufacturing a transfer mask according to Configuration 17 or 34 on a mask stage of an exposure apparatus; and transferring a transfer pattern of the transfer mask onto a semiconductor substrate by a lithography method.

Effects

Even if the mask blank substrate according to the present disclosure has a thickness variation so as to affect the change in surface shape of the front main surface of the substrate when the transfer mask manufactured using the substrate is chucked to the mask stage of the exposure apparatus, the thickness variation tends to be easily corrected by the wavefront correction function of the exposure apparatus. Thus, with the use of the wavefront correction function of the exposure apparatus, a transfer pattern of the transfer mask can be transferred to a transfer target object by exposure with high accuracy. As a result, a semiconductor device with a stable circuit operation can be manufactured.

MODE(S) FOR CARRYING OUT THE DISCLOSURE

Figure 1:
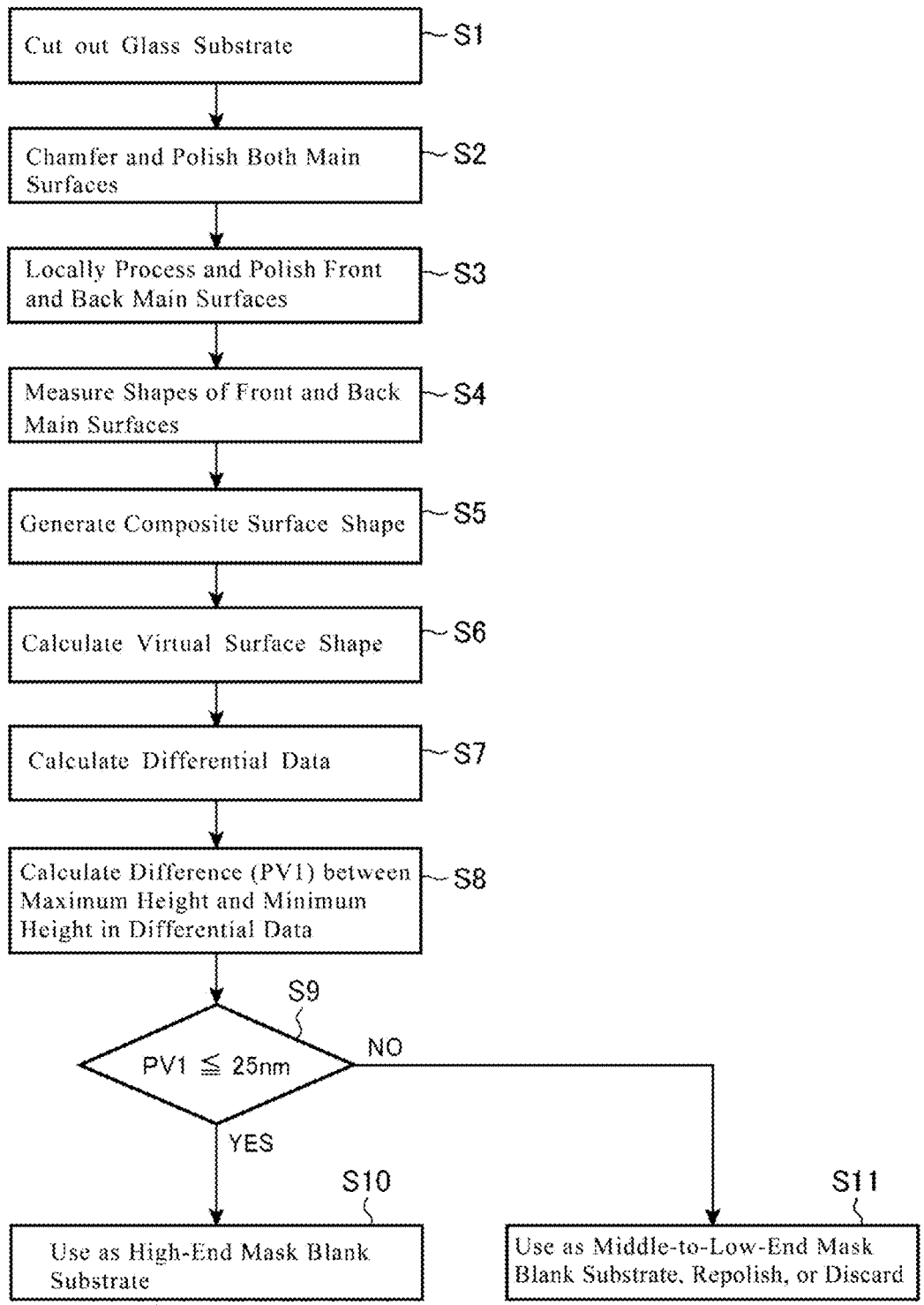
FIG. 1 is a process flow chart showing manufacturing a mask blank substrate according to the present disclosure.

The embodiments for carrying out the present disclosure, including the concept, are specifically described below with reference to the drawings. In the drawings, identical or corresponding parts are given identical reference numerals, so that their explanation may be simplified or omitted.

[Mask Blank Substrate and its Manufacturing Method]

Here, a mask blank substrate and its manufacturing method are described. The constructive concept of the present disclosure is initially described, followed by Examples based on the concept along with Comparative Examples and Reference Examples.

The present disclosure is characterized in that the idea is changed to achieve the in-plane distribution of thickness variation to easily correct the wavefront by the wavefront correction function of the exposure apparatus, in view of the fact that there is a limitation in reduction of thickness variation of the substrate constituting the transfer mask. In particular, if the entire back main surface is chucked to the mask stage as in the reflective mask, the back main surface of the substrate is corrected to be flat, and thus, a strong effect of the in-plane distribution of thickness variation is found in the front main surface having a transfer pattern. The present disclosure was made on the assumption that the wavefront correction function of the exposure apparatus is used and that the shape corrected by the wavefront correction function can be defined by a Zernike polynomial.

The exposure light to which the wavefront correction by the wavefront correction function is to be applied is reflected light which is reflected from the front main surface (specifically, a multi-layer reflective film on the front main surface). The reflected light has a shape of an equivalent wavefront in which the surface shape of the front main surface is reflected. If the shape of the equivalent wavefront of the reflected light can be corrected by the wavefront correction function to have a substantially ideal shape, the reflective mask using the substrate will have transfer accuracy substantially equal to the reflective mask using the substrate without the thickness variation. The shape which can be corrected by the wavefront correction function of the exposure apparatus is a shape definable by a Zernike polynomial. In view of the above, the substrate which can provide a higher corrective effect by the wavefront correction function can be regarded as having either no or a small difference between the shape of the in-plane distribution of thickness variation of the substrate and the shape definable by the Zernike polynomial.

Based on the above, the mask blank substrate of the present disclosure includes a mask blank substrate including a substrate having two opposite main surfaces. It is characterized in that: when the shape fitting between a virtual surface shape and a composite surface shape obtained by composing respective surface shapes of the two main surfaces is performed in a calculation region inside a circle 104 mm in diameter based on the center of the substrate to obtain differential data, a difference between the maximum height and the minimum height within the calculation region in the differential data is 25 nm or less; and the virtual surface shape has a shape defined by a Zernike polynomial expressed in a polar coordinate system, wherein the Zernike polynomial is composed of only terms in which the order of variables related to a radius is second or lower order and includes one or more terms in which the order of the variables related to a radius is second-order.

As stated above, especially when the substrate is made of multi-component glass or crystallized glass as used in a low thermal expansion substrate, the measuring light is easily affected within the substrate, and thus, it is difficult to accurately measure the substrate thickness. It is also difficult to measure the surface shapes of the front and back main surfaces of the substrate and obtain, from the results, the in-plane distributions of thickness variation. By the measurement, the surface shapes of the main surfaces can be obtained as in-plane distributions of height from respective predetermined reference surfaces. However, the respective predetermined reference surfaces which act as references for the surface shapes of the two main surfaces are not identical to each other. Therefore, an accurate thickness value cannot be obtained at each in-plane measurement point, and the in-plane distributions of thickness variation are relative values. Further, since it is also difficult to adjust the two reference surfaces to be located parallel to each other, the relative values for the in-plane distributions of thickness variation calculated from measured results of the surface shapes of the two main surfaces include an error in tilt component. However, the error in tilt component is a component which can be defined by a low-order term of a Zernike polynomial, and can be easily corrected by the wavefront correction function.

The present disclosure applies the composite surface shape obtained by composing respective surface shapes of the two main surfaces (front and back main surfaces) of the substrate as the in-plane distribution of thickness variation (in-plane variation related to the relative values for thickness) of the substrate. Specifically, the composite surface shape is obtained by adding together the surface shape of one main surface of the substrate and the surface shape of the other main surface. The surface shape of the one main surface is an in-plane distribution of height from a reference surface (first reference surface) acting as a reference for the surface shape of the one main surface to the one main surface, and the surface shape of the other main surface is an in-plane distribution of height from a reference surface (second reference surface) acting as a reference for the surface shape of the other main surface to the other main surface. The composite surface shape may be obtained by addition after tilt correction of one of the reference surfaces and the in-plane distribution of height based on the one reference surface such that the reference surface (first reference surface) acting as a reference for the surface shape of the one main surface and the reference surface (second reference surface) acting as a reference for the surface shape of the other main surface are parallel to each other. Alternatively, the composite surface shape may be obtained by addition without the tilt correction. This is because the error in tilt component is a component which can be defined by a low-order term of a Zernike polynomial, and can be easily corrected by the wavefront correction function, as stated above.

The present disclosure utilizes, as the virtual surface shape, a shape defined by a Zernike polynomial expressed in a polar coordinate system. The origin of the polar coordinate is the center of the mask blank substrate. Since the widely-used mask blank is a square shape having length and width of about 152 mm while some corner portions are chamfered, and a layout of a mask pattern figure is shown in an X-Y coordinate, the X-Y coordinate system is usually used for representation in a coordinate system. The feature of the present disclosure is that the quadrilateral mask blank is purposely expressed in the polar coordinate system. The Zernike polynomial is expressed in the polar coordinate system, and respective variables are independent and can be easily treated, while aberration characteristics of the reflective mirror of the projection optical system correspond to respective terms of Zernike polynomial expansion for a wavefront of the reflective mirror that is Fourier transform plane. Thus, the Zernike polynomial may be used. The exposure apparatus having the wavefront correction function includes the exposure apparatus for reflective lithography using the EUV light as the exposure light, as well as the exposure apparatus using the ArF excimer laser light as the exposure light, etc., and any of these is applicable.

The wavefront correction function of the exposure apparatus can also operate when the order of variables related to a radius in the Zernike polynomial is third or higher order. The fitting using even the high-order term is applicable at a point in time, but it was found that it causes a variation in high-order aberration of the reflective mirror depending on the exposure conditions, which is disadvantageous. Further, it was found that the Zernike polynomial including only the first-order terms leads to one-dimensional tilt correction, which cannot provide sufficient optical flatness. Therefore, as a result of in-depth consideration, it was found that it is important that the Zernike polynomial is composed of only terms in which the order of variables related to a radius is second or lower order and includes one or more terms in which the order of the variables related to a radius is second-order. The representative second-order term required is a defocus term, which corresponds to the fourth term in The University of Arizona style, and to the fifth term in the standard style. This is the third feature of the present invention. The Zernike polynomial includes various styles, such as the standard style, The University of Arizona style, and the fringe Zernike style. However, regarding the term where the order of the variables related to a radius is second or lower order, any style of Zernike polynomial approximation can be used for application of the present invention, though there are differences in the order and coefficients.

The calculation region, which is a region where the fitting between the virtual surface shape and the composite surface shape of the substrate is performed to derive the differential data and where the difference between the maximum height and the minimum height in the differential data, a so-called PV value, is calculated, may be located inside a circle 104 mm in diameter that is equal to the maximum value of exposure slit length upon scanning exposure by the exposure apparatus. Even a one point deviation of PV value causes a similar degree of deviation in the wavefront at that point, which adversely affects the transfer properties on that site. The PV value that is a reference for selection should be 25 nm or less. The PV value may be 24 nm or less, and may be 22 nm or less.

According to the mask blank substrate of the present disclosure, the composite surface shape obtained by composing respective surface shapes of two main surfaces of the substrate has a difference (PV value) of 90 nm or less between the maximum height and the minimum height in an inner region of a square shape having a side of 132 mm based on the center of the substrate. If the substrate has a large thickness variation such that the PV value of the composite surface shape is more than 90 nm in spite of the PV value in the differential data of 25 nm or less, the amount of wavefront correction by the wavefront correction function will be large. Thus, if such a substrate is used to manufacture a transfer mask, the transfer pattern tends to have a large amount of position displacement, which is unfavorable.

With the above procedure, the transfer accuracy is ensured in a region inside a circle 104 mm in diameter based on the center of the mask blank, but chip exposure is carried out in 104 mm×132 mm region at a maximum. Then, when the reference in which the flatness in an inner region of a square shape having a side of 132 mm based on the center of the mask blank substrate is 0.2 µm or less is used in addition to the reference mentioned above, further preferable transfer results are obtained throughout the surface. While the chip exposure at the maximum of 104 mm×132 mm is smaller than the measurement reference region of 132 mm×132 mm, this is for the purpose of not limiting the orientation of the mask blank. Further, the main surface of the mask blank substrate should be mirror-polished to a predetermined surface roughness or more. In the main surface, root mean square roughness Rq calculated within an inner region of a square shape having a side of 5 µm is preferably 0.2 nm or less, and more preferably 0.15 nm or less. The surface roughness can be measured using, e.g., an atomic force microscope (AFM).

A material for forming the above mask blank substrate includes low thermal expansion glass that is multi-component glass such as $SiO_2$—$TiO_2$ glass, $SiO_2$—$TiO_2$—$SnO_2$ glass, and $SiO_2$—$Al_2O_3$—$Li_2O$ glass; crystallized glass;

synthetic quartz glass; soda-lime glass; aluminosilicate glass; borosilicate glass; alkali-free glass; calcium fluoride glass, and the like.

Regarding the first aspect of the method for manufacturing a mask blank substrate of the present invention, the manufacturing steps are described below with reference to the flow chart in FIG. 1.

First, as shown in block S1 in FIG. 1, a glass ingot is cut out into the shape of a mask blank substrate, followed by the step of grinding and polishing a main surface, an end face, and a chamfered surface of the cut-out substrate as shown in block S2 of FIG. 1. The polishing is normally carried out in multiple stages. There are various polishing methods, including Chemical Mechanical Polishing (CMP) using polishing agents such as cerium oxide and polishing using polishing agents such as colloidal silica without particular limitation. Subsequently, the front and back main surfaces (two main surfaces) are respectively subjected to the step of obtaining the surface shape of the main surface and locally processing a relatively convex region on the main surface, and further subjected to briefly polishing the front and back main surfaces, as shown in block S3 of FIG. 1.

After that, the shapes of the front and back main surfaces are measured as shown in block S4 of FIG. 1. This surface measurement allows the acquirement of the surface shape of the one main surface that is the in-plane distribution of height from the reference surface (first reference surface) acting as a reference for the surface shape of the one main surface to the one main surface, as well as the surface shape of the other main surface that is the in-plane distribution of height from the reference surface (second reference surface) acting as a reference for the surface shape of the other main surface to the other main surface. The blocks up to block S4 given above can be conducted with normal methods.

The characteristic of this disclosure resides in block S5 and the subsequent blocks in FIG. 1. First, a composite surface shape is generated in block S5. Here, the surface shape of the one main surface and the surface shape of the other main surface obtained in block S4 are composed to generate the composite surface shape. In particular, the surface shape of the one main surface and the surface shape of the other main surface of the substrate are added together to obtain the composite surface shape. This acquisition of the composite surface shape is applied if positive directions of height from respective reference surfaces for the shapes of the two main surfaces are different from each other. If the positive directions of height from respective reference surfaces for the shapes of the two main surfaces are identical to each other, positive/negative of a value of height related to the shape of one of the main surfaces should be inverted to be added to the shape of the other of the main surfaces.

Next, the virtual surface shape is calculated in block S6. As mentioned above, the virtual surface shape is a shape defined by a Zernike polynomial expressed in a polar coordinate system, wherein the Zernike polynomial is composed of terms in which the order of variables related to a radius is second or lower order and includes one or more terms in which the order of the variables related to a radius is second-order. Its extent is within a circle 104 mm in diameter centered on the center of the mask blank substrate. The virtual surface shape is calculated with reference to the composite surface shape generated in block S5.

Next, as shown in block S7 of FIG. 1, the difference between the virtual surface shape calculated in block S6 and the composite surface shape of the substrate calculated in block S5 is computed to calculate difference shape data (differential data) (a fitting region is a region within the circle 104 mm in diameter). Thereafter, as shown in block S8 of FIG. 1, the difference between the maximum height and the minimum height, a so-called PV value (PV1), is calculated from the differential data obtained in block S7 (the calculation region for calculating PV1 is also a region within the circle 104 mm in diameter). After that, as shown in block S9 of FIG. 1, judgment is made whether the value of PV1 determined in block S8 is 25 nm or less, or beyond that value, and if the value is 25 nm or less, selection is made as a high-end mask blank substrate, and the step is concluded (block S10 in FIG. 1). If PV1 is more than 25 nm, the application as a middle-to-low-end mask blank substrate for middle layer or rough layer is considered; the mask blank substrate is returned to the polishing step in block S2, or returned to the local processing/polishing step in block S3 to undergo block S4 and the subsequent steps again; or alternatively, the mask blank substrate is discarded (block S11 in FIG. 1).

The method of manufacturing a mask blank substrate described above can allow the manufacture of a mask blank substrate with high throughput, which can achieve, by the wavefront correction function of the exposure apparatus, the transfer accuracy equivalent to that of the transfer mask manufactured from the substrate having a PV value of 25 nm or less on its surface in a region within a circle 104 mm in diameter.

Next, regarding the second aspect of the method for manufacturing a mask blank substrate of the present invention with the use of a PV value for the composite surface shape, the manufacturing steps are described below with reference to the flow chart in FIG. 2. The steps up to block S5 are identical to those of the manufacturing method of the mask blank substrate in FIG. 1 described above. Block S5 and the subsequent blocks are different, and the PV value (PV0) that is a difference between the maximum height and the minimum height for the composite surface shape is calculated as shown in Step S12 of FIG. 2 (the calculation region is an inner region within a square shape having a side of 132 mm based on the center of the substrate). As shown in block S13 of FIG. 2, only the substrate in which PV0 is 90 nm or less proceeds on to block S6 and the subsequent steps. However, the substrate in which PV0 is greater than 90 nm does not proceed on to block S6 and the subsequent steps, and the application as a mask blank substrate for middle layer or rough layer is considered; the mask blank substrate is returned to the polishing step in block S2, or returned to the local processing/polishing step in block S3 to undergo block S4 and the subsequent steps again; or alternatively, the mask blank substrate is discarded (block S11 in FIG. 2). If the substrate has a large thickness variation such that the PV value of the composite surface shape exceeds 90 nm in spite of the PV value in the differential data of 25 nm or less, the amount of wavefront correction by the wavefront correction function will tend to be excessive. If such a substrate is used to manufacture a transfer mask, the transfer pattern tends to have a large amount of position displacement, which is unfavorable.

Blocks S12 and S13 may be carried out at any stages as long as block S5 for generating the composite surface shape has been carried out. For example, blocks S12 and S13 can be carried out between block S9 and block S10. The information of the virtual surface shape determined here is stored, and is reflected in the wavefront correction function used in exposure transfer by the exposure apparatus using the transfer mask manufactured from the mask blank substrate of the present disclosure. In the process of manufacturing a mask blank substrate of the present disclosure, it includes selecting a substrate in which the flatness of its main surface on the side of provision of a thin film for transfer pattern formation is 0.2 µm or less in an inner region within a square shape having a side of 132 mm based on the center of the substrate. The selecting a substrate having the flatness of 0.2 µm or less may be carried out after the measuring the shapes of the front and back main surfaces at block S4 in terms of efficient selection of a use.

[Multi-layer Reflective Film Coated Substrate and its Manufacturing Method]

The multi-layer reflective film coated substrate according to the first aspect of the present disclosure characterized in that a multi-layer reflective film is provided on one main surface of the above mask blank substrate. The multi-layer reflective film is a multi-layer film which functions to reflect the exposure light that is the EUV light. While the multi-layer reflective film may be made of any material as long as it reflects the EUV light, the reflectance of the multi-layer reflective film alone is generally 65% or more, and the upper limit is usually 73%. In general, the multi-layer reflective film may include a high refractive index layer made of a high refractive index material and a low refractive index layer made of a low refractive index material, which are alternately laminated in about 40 to 60 periods.

For example, as the multi-layer reflective film for the EUV light with a wavelength of 13 to 14 nm, a periodically laminated Mo/Si film, which is formed by alternately laminating Mo and Si films in about 40 periods, may be used. Other multi-layer reflective films used in the EUV light region may include Ru/Si periodic multi-layer film, Mo/Be periodic multi-layer film, Mo compound/Si compound periodic multi-layer film, Si/Nb periodic multi-layer film, Si/Mo/Ru periodic multi-layer film, Si/Mo/Ru/Mo periodic multi-layer film, Si/Ru/Mo/Ru periodic multi-layer film, and the like.

The multi-layer reflective film can be formed by forming respective layers using, for example, a magnetron sputtering method, an ion beam sputtering method, or the like. In the above described Mo/Si periodic multi-layer film, a Si target is used to form a Si film having a few-nanometer thickness on the substrate, and then, a Mo target is used to form a Mo film having a few-nanometer thickness, through the ion beam sputtering method, for example. These Si and Mo films, regarded as one period, are laminated in 40 to 60 periods, so as to form the multi-layer reflective film.

The multi-layer reflective film includes a protective film on an uppermost layer. The material for the protective film may include, for example, Ru, Ru—(Nb,Zr,Y,B,Ti,La,Mo), Si—(Ru,Rh,Cr,B), Si, Zr, Nb, La, B, etc. If the material containing ruthenium (Ru) is used, the reflectance property of the multi-layer reflective film can be improved. In particular, the material is may be Ru, Ru—(Nb, Zr, Y, B, Ti, La, Mo).

Respective layers constituting the multi-layer reflective film are generally formed by the sputtering methods, as above. The multi-layer reflective film (including such a film having the protective film) formed by these film forming methods has high uniformity in in-plane distribution of film thickness. Thus, the surface shape of the one main surface of the mask blank substrate is considerably reflected in the surface shape of the multi-layer reflective film. In the case of the multi-layer reflective film coated substrate, the exposure light is reflected by the multi-layer reflective film, and thus, the equivalent wavefront of the reflected exposure light has a shape strongly affected by the surface shape of the multi-layer reflective film. In view of the above, the multi-layer reflective film coated substrate according to the first aspect of the present invention, which includes the multi-layer reflective film on the one main surface of the above described mask blank substrate, also provides the effect similar to the mask blank substrate of the present disclosure.

The multi-layer reflective film coated substrate of the present invention includes the configuration in which a conductive film primarily intended for electrostatic chucking is provided on the other main surface. An electrical property (sheet resistance) required for the conductive film is generally 100 Ω/sq. or less. The method for forming a conductive film is publicly known. For example, the conductive film can be formed using an alloy or metal target such as Cr and Ta by the magnetron sputtering method or ion beam sputtering method. The conductive film is also generally formed by the sputtering methods, and has high uniformity in in-plane distribution of film thickness. Therefore, the surface shape of the other main surface is reflected in the surface shape of the conductive film. Based on the above, the multi-layer reflective film coated substrate in which the conductive film is provided on the other main surface also provides the effect similar to the multi-layer reflective film coated substrate with the other main surface being exposed.

The method for manufacturing a multi-layer reflective film coated substrate according to the first aspect of the present invention includes the step of providing the multi-layer reflective film on one main surface of the mask blank substrate manufactured by the above method for manufacturing a mask blank substrate. In particular, the method for manufacturing a multi-layer reflective film coated substrate according to the first aspect of the present disclosure includes the additional providing a multi-layer reflective film on one main surface of a high-end mask blank substrate selected in block S10 in the flow chart for the method for manufacturing a mask blank substrate according to the first aspect (FIG. 1) or in the flow chart for the method for manufacturing a mask blank substrate according to the second aspect (FIG. 2). The multi-layer reflective film coated substrate manufactured by the method for manufacturing a multi-layer reflective film coated substrate according to the first aspect can provide the effect similar to the above-described multi-layer reflective film coated substrate according to the first aspect. The other matters regarding the method for manufacturing a multi-layer reflective film coated substrate according to the first aspect are similar to those of the above-described multi-layer reflective film coated substrate according to the first aspect.

As a multi-layer reflective film coated substrate according to the second aspect of the present disclosure, there is provided a multi-layer reflective film coated substrate which includes a multi-layer reflective film on one of two opposite main surfaces of a substrate and a conductive film on the other main surface, characterized in that: when the shape fitting between a virtual surface shape and a composite surface shape obtained by composing a surface shape of the multi-layer reflective film and a surface shape of the conductive film is performed in a calculation region inside a circle 104 mm in diameter based on the center of the substrate to obtain differential data, the difference between the maximum height and the minimum height within the calculation region in the differential data is 25 nm or less; and the virtual surface shape has a shape defined by a Zernike polynomial expressed in a polar coordinate system, wherein the Zernike polynomial is composed of only terms in which the order of variables related to a radius is second or lower order and includes one or more terms in which the order of the variables related to a radius is second-order.

The multi-layer reflective film coated substrate according to the second aspect differs from the above-described multi-layer reflective film coated substrate according to the first aspect in that the composite surface shape is generated from the surface shape of the multi-layer reflective film and the surface shape of the conductive film to perform the shape fitting of the virtual surface shape to the composite surface shape. The composite surface shape is preferably obtained by adding together the surface shape of the multi-layer reflective film that is an in-plane distribution of height from a reference surface (third reference surface) acting as a reference for the surface shape of the multi-layer reflective film to a surface of the multi-layer reflective film, and the surface shape of the conductive film that is an in-plane distribution of height from a reference surface (fourth reference surface) acting as a reference for the surface shape of the conductive film to a surface of the conductive film.

As above, the surface shape of the multi-layer reflective film is influenced by a tendency of the surface shape of the one main surface thereunder, and the surface shape of the conductive film is significantly influenced by a tendency of the surface shape of the other main surface thereunder. Further, both the multi-layer reflective film and conductive film have high in-plane uniformity of film thickness. Moreover, even if the reference surface (first reference surface) that acts as a reference for the surface shape of the one main surface differs from the reference surface (third reference surface) that acts as a reference for the surface shape of the multi-layer reflective film, the tilt component between the two reference surfaces can be easily corrected by the wavefront correction function as described above. This also applies to the reference surface (second reference surface) for the surface shape of the other main surface and the reference surface (fourth reference surface) that acts as a reference for the surface shape of the conductive film. From the above, it would be possible to define the substrate having a surface shape which can also be easily corrected by the wavefront correction function of the exposure apparatus if the composite surface shape generated from the surface shape of the multi-layer reflective film and the surface shape of the conductive film is used. The other matters regarding the multi-layer reflective film coated substrate according to the second aspect are similar to those of the multi-layer reflective film coated substrate according to the first aspect described above.

As a method for manufacturing a multi-layer reflective film coated substrate according to the second aspect of the disclosure, there is provided a method of manufacturing a multi-layer reflective film coated substrate including a multi-layer reflective film on one of two opposite main surfaces of a substrate and a conductive film on the other main surface, characterized in that: the method includes: preparing a substrate including a multi-layer reflective film on the one main surface and a conductive film on the other main surface; performing the shape fitting between a virtual surface shape and a composite surface shape obtained by composing a surface shape of the multi-layer reflective film and a surface shape of the conductive film in a calculation region inside a circle 104 mm in diameter based on the center of the substrate to obtain differential data; and selecting, as a multi-layer reflective film coated substrate, the substrate in which a difference between the maximum height and the minimum height within the calculation region in the differential data is 25 nm or less; the virtual surface shape has a shape defined by a Zernike polynomial expressed in a polar coordinate system, and the Zernike polynomial is composed of only terms in which the order of variables related to a radius is second or lower order and includes one or more terms in which the order of the variables related to a radius is second-order.

This method of manufacturing a multi-layer reflective film coated substrate according to the second aspect differs from the method for manufacturing a multi-layer reflective film coated substrate according to the first aspect above in that the substrate is prepared to have the multi-layer reflective film on one main surface and the conductive film on the other main surface, and the composite surface shape is generated from the surface shape of the multi-layer reflective film and the surface shape of the conductive film to perform the shape fitting of the virtual surface shape to the composite surface shape. The composite surface shape is obtained by adding together the surface shape of the multi-layer reflective film that is the in-plane distribution of height from the reference surface (third reference surface) acting as a reference for the surface shape of the multi-layer reflective film to the surface of the multi-layer reflective film, and the surface shape of the conductive film that is the in-plane distribution of height from the reference surface (fourth reference surface) acting as a reference for the surface shape of the conductive film to the surface of the conductive film.

Figure 2:
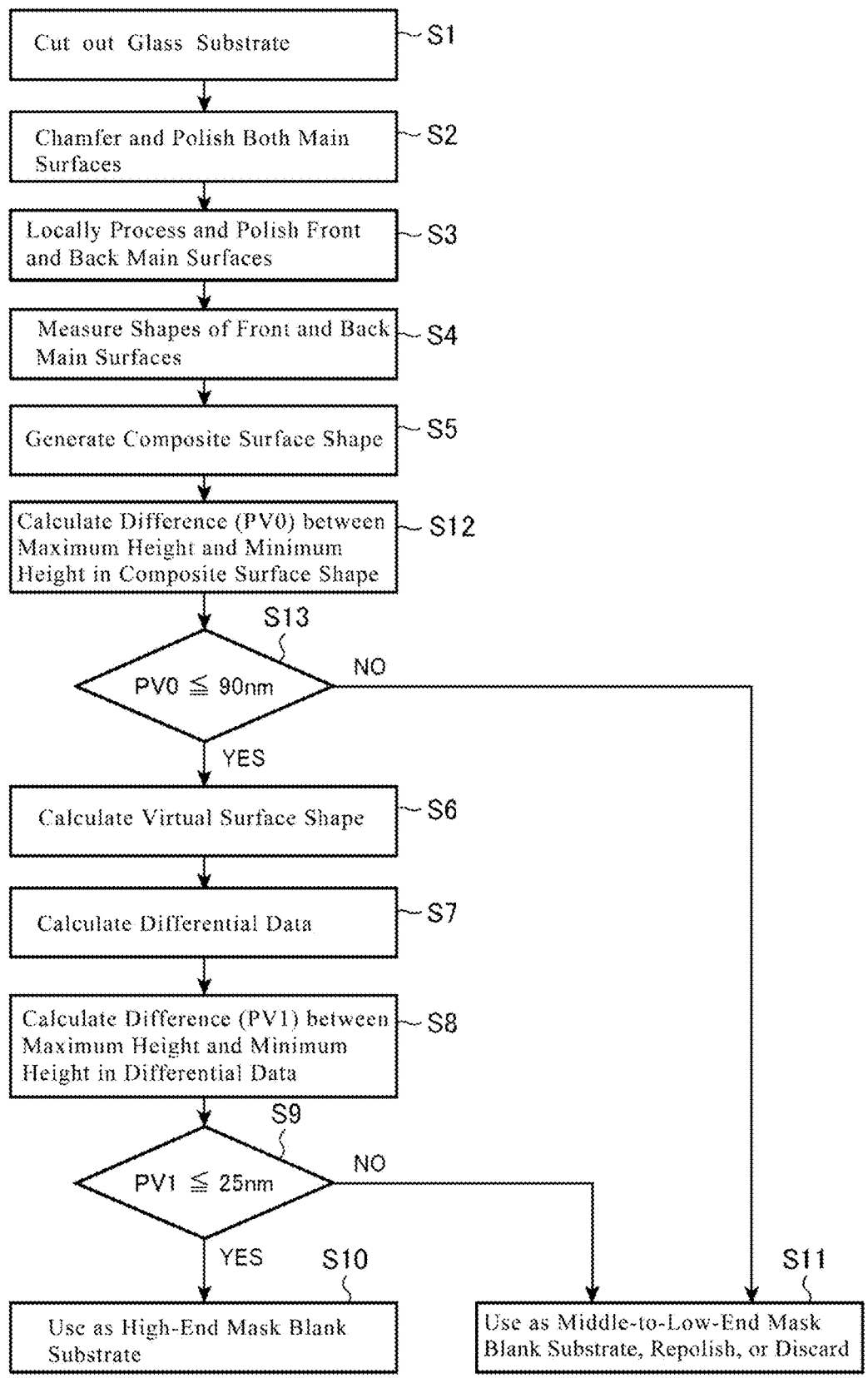
FIG. 2 is a process flow chart showing manufacturing a mask blank substrate according to the present disclosure.

The method of manufacturing a multi-layer reflective film coated substrate according to the second aspect is specifically described below with reference to the flow chart for the method of manufacturing a mask blank substrate according to the first aspect (FIG. 1) or the flow chart for the method of manufacturing a mask blank substrate according to the second aspect (FIG. 2). The substrate with its front and back main surfaces being mirror finished after block S3 is subjected to providing the multi-layer reflective film on one main surface and providing the conductive film on the other main surface. Even if the order of the providing the multi-layer reflective film and the providing the conductive film is inverted, there is no particular influence on the effect of the present disclosure. Subsequently, in block S4, instead of measuring the surface shapes of the front and back main surfaces of the substrate, the surface shape of the multi-layer reflective film and the surface shape of the conductive film are measured. That is, the surface shape of the multi-layer reflective film that is the in-plane distribution of height from the reference surface (third reference surface) acting as a reference for the surface shape of the multi-layer reflective film to the surface of the multi-layer reflective film, and the surface shape of the conductive film that is the in-plane distribution of height from the reference surface (fourth reference surface) acting as a reference for the surface shape of the conductive film to the surface of the conductive film are measured. Then, in block S5, the surface shape of the multi-layer reflective film and the surface shape of the conductive film are composed to generate the composite surface shape. Block S6 and the subsequent blocks are similar to those of the respective flow charts in FIGS. 1 and 2.

The multi-layer reflective film coated substrate manufactured by the method for manufacturing a multi-layer reflective film coated substrate according to the second aspect provides an effect similar to the multi-layer reflective film coated substrate manufactured by the method for manufacturing a multi-layer reflective film coated substrate according to the first aspect above. The other matters regarding the method for manufacturing a multi-layer reflective film coated substrate according to the second aspect are similar to those of the method for manufacturing a multi-layer reflective film coated substrate according to the first aspect above.

[Mask Blank and its Manufacturing Method]

The mask blank according to the first aspect of the present disclosure is characterized in that a thin film for transfer pattern formation is provided on one main surface of the mask blank substrate of the present invention. The mask blank according to the first aspect is used to manufacture a transfer mask used in transmission lithography. While the ArF excimer laser light is the exposure light used in this lithography, the KrF excimer laser light is also applicable. A transfer mask manufactured from the mask blank of this aspect should allow the exposure light to pass through the substrate with a high transmittance. As a material for forming the substrate of the mask blank of this aspect, synthetic quartz glass, soda-lime glass, aluminosilicate glass, borosilicate glass, alkali-free glass, calcium fluoride glass, and the like can be used. The synthetic quartz glass is may be used since it has a high transmittance to the ArF exposure light.

The thin film for transfer pattern formation is generally formed by the sputtering methods. The thin film formed by these film forming methods has high uniformity in in-plane distribution of film thickness. Thus, the surface shape of the one main surface of the mask blank substrate is significantly reflected in a surface shape of the thin film. From the above, the mask blank according to the first aspect of the present invention which includes a thin film for pattern formation on one main surface of the above-described mask blank substrate of the present disclosure also provides the effect similar to the mask blank substrate of the present disclosure.

Regarding the lithography using a transmission-type mask, in particular, the exposure apparatuses utilizing the ArF exposure light are increasingly employing the wavefront correction function. Therefore, using the mask blank substrate of the present disclosure with a small in-plane distribution of thickness variation, the wavefront correction function can work more effectively. Immediately after forming a thin film, including a thin film for pattern formation, on a main surface of the substrate by the sputtering methods, the film stress exists in the thin film. If the mask blank substrate becomes strained due to the stress in the thin film, the flatness of the substrate surface changes. The deformation of the substrate main surface due to the film stress is a concentric quadric surface, which is relatively simple, and can be dealt with by the wavefront correction function of the exposure apparatus.

However, if the stress in the thin film for pattern formation is excessive, it gives rise to the problem of position displacement of a thin film pattern upon patterning the thin film in the manufacture of a transfer mask from the mask blank. Based on the center of the mask blank, a relationship between the film stress and an amount of change in mechanical flatness in an inner region within a square shape having a side of 132 mm was examined. As a result, the film stresses corresponding to the amounts of change in flatness of 10 nm, 20 nm, 25 nm, 30 nm, 40 nm, and 50 nm were 55 MPa, 110 MPa, 137 MPa, 165 MPa, 220 MPa, and 275 MPa, respectively. From this result, it can be understood that the stress of the thin film may be 275 MPa or less, may be 165 MPa or less, and even may be 110 MPa or less. The method of adjusting the stress of the thin film includes, for example, a method of heating treatment (annealing) and a method of light irradiation treatment for irradiating the thin film with high energy light from a flash lamp, etc.

The following configurations (1) to (3) can be applied to the mask blank according to the first aspect of the present disclosure.

(1) A Binary Mask Blank with a Light Shielding Film Made of a Material Containing a Transition Metal The binary mask blank is configured to include a light shielding film (thin film for pattern formation) on a substrate, and the light shielding film is made of a transition metal simple substance such as chromium, tantalum, ruthenium, tungsten, titanium, hafnium, molybdenum, nickel, vanadium, zirconium, niobium, palladium, and rhodium, or a material containing a compound thereof. One example is a light shielding film made of chromium, or a chromium compound containing chromium and one or more elements selected from oxygen, nitrogen, carbon, etc. added thereto. A further example is a light shielding film comprised of a tantalum compound containing tantalum and one or more elements selected from oxygen, nitrogen, boron, etc. added thereto. Such a binary mask blank includes a light shielding film configured as a two-layer structure of a light shielding layer and a front-surface antireflection layer, or as a three-layer structure having a back-surface antireflection layer between the light shielding layer and the substrate. The light shielding film may be a composition gradient film in which the composition in the film thickness direction varies continuously or gradually.

(2) A Phase Shift Mask Blank including a Light-Semitransmissive Film Made of a Material Containing Silicon and Nitrogen or a Material Containing a Compound of a Transition Metal and Silicon (Including Transition Metal Silicide, Particularly Molybdenum Silicide)

Such a phase shift mask blank is configured to have a light-semitransmissive film (thin film for pattern formation) on a substrate, and the light-semitransmissive film is patterned to provide a shifter portion, so that a halftone type phase shift mask is manufactured. In order to prevent pattern defects of the transfer target substrate due to a light-semitransmissive film pattern formed on a transfer region based on light transmitted through the light-semitransmissive film, such a phase shift mask may have the light-semitransmissive film on the substrate and a light shielding film (light shielding band) thereon. In addition to the halftone type phase shift mask blank, there are mask blanks for a Levenson phase shift mask which is a substrate dug-down type where a substrate is dug by etching, etc. to provide a shifter portion, for an enhancer-type phase shift mask, and for a chromeless phase lithography (CPL) mask.

The light-semitransmissive film of the halftone type phase shift mask blank allows the transmission of light at an intensity not substantially contributing to the light exposure (e.g., 1% to 30% with respect to the exposure wavelength), and has a predetermined phase difference (e.g., 180 degrees). A light-semitransmissive portion formed by patterning the light-semitransmissive film, and a light-transmissive portion which allows the transmission of light at an intensity substantially contributing to the light exposure and has no light-semitransmissive film formed thereon are provided, such that a phase of light transmitted through the light-semitransmissive portion is in a substantially inverted relation with respect to a phase of light transmitted through the light-transmissive portion. As a result, the light transmitted through the light-semitransmissive portion and the light transmitted through the light-transmissive portion pass near a boundary between the light-semitransmissive portion and the light-transmissive portion, and enter the other's region due to a diffraction phenomenon, thereby annihilating both of them, so that a light intensity at the boundary is nearly zero and a contrast, i.e., a resolution, at the boundary is improved.

The light-semitransmissive film is made of a material containing, e.g., a compound of a transition metal and silicon (including transition metal silicide), including a material containing, as primary components, the transition metal and silicon, and oxygen and/or nitrogen. The applicable transition metal includes molybdenum, tantalum, tungsten, titanium, hafnium, nickel, vanadium, zirconium, niobium, palladium, ruthenium, rhodium, chromium, etc. Further, in the case of a configuration where a light shielding film is formed on the light-semitransmissive film, since the material for the light-semitransmissive film includes a transition metal and silicon, the material of the light shielding film is preferably made of chromium, or a chromium compound containing chromium and elements such as oxygen, nitrogen, and carbon, which has etching selectivity (etching durability) with respect to the light-semitransmissive film.

The light-semitransmissive film may be made of a material containing silicon and nitrogen. Specifically, the light-semitransmissive film is made of a material containing silicon and nitrogen, or a material containing one or more elements selected from metalloid elements, non-metallic elements, and noble gases added thereto. It is preferable to contain one or more elements selected from boron, germanium, antimony, and tellurium as metalloid elements contained in the light-semitransmissive film. The light-semitransmissive film can contain any non-metallic elements in addition to nitrogen. Among the non-metallic elements, it is preferable to contain one or more elements selected from carbon, fluorine, and hydrogen. A low transmissive layer and a high transmissive layer preferably have the oxygen content of 10 at % or less, and may be 5 at % or less. Further, they do not positively contain oxygen (the result of composition analysis, such as RBS or XPS, is not more than the detection lower limit).

The light-semitransmissive film may have a structure which includes one or more pairs of a low transmissive layer including the relatively low nitrogen content and a high transmissive layer including the relatively high nitrogen content. The matters regarding the material of the light shielding film on the light-semitransmissive film made of a material containing silicon and nitrogen are also similar to those of the light-semitransmissive film made of a material containing the compound of a transition metal and silicon mentioned above.

Since a Levenson phase shift mask and a CPL mask are manufactured from a mask blank with a structure similar to a binary mask blank, the structure of a thin film for pattern formation is similar to that of a light shielding film of the binary mask blank. While a light-semitransmissive film of a mask blank for an enhancer-type phase shift mask allows transmission of light at an intensity not substantially contributing to the light exposure (e.g., 1% to 30% with respect to the exposure wavelength), it has a small phase difference caused in the transmitted exposure light (e.g., the phase difference of 30 degrees or less, and preferably 0 degrees), which is different from the light-semitransmissive film for the halftone phase shift mask blank. While the material for this light-semitransmissive film includes elements similar to those of the light-semitransmissive film of the halftone phase shift mask blank, the film thickness and a composition ratio of each element are adjusted to achieve a predetermined small phase difference and predetermined transmittance with respect to the exposure light.

(3) A Binary Mask Blank with a Light Shielding Film Made of a Material Containing a Compound of a Transition Metal and Silicon (including Transition Metal Silicide, Particularly Molybdenum Silicide)

The light shielding film (thin film for pattern formation) is made of a material containing a compound of a transition metal and silicon, which may include a material containing, as primary components, the transition metal and silicon, and at least one or more of oxygen or nitrogen. Further, the light shielding film can be made of a material containing, as major components, a transition metal and at least one or more of oxygen, nitrogen, or boron. The applicable transition metal includes molybdenum, tantalum, tungsten, titanium, hafnium, nickel, vanadium, zirconium, niobium, palladium, ruthenium, rhodium, chromium, etc. In particular, there is a light shielding film made of a compound of molybdenum silicide, which may have a two-layer structure of a light shielding layer (such as MoSi) and a front-surface antireflection layer (such as MoSiON), or a three-layer structure having a back-surface antireflection layer (such as MoSiON) between the light shielding layer and the substrate. Also, the light shielding film may be a composition gradient film in which the composition in the film thickness direction varies continuously or gradually.

Further, for thinning the thickness of a resist film to form a fine pattern, the light shielding film can be configured to have an etching mask film thereon. This etching mask film may be made of a material having etching selectivity (etching durability) in the etching of the light shielding film containing the transition metal silicide, and may be made of chromium, or a material of a chromium compound containing chromium and elements such as oxygen, nitrogen, and carbon added thereto. At this stage, a transfer mask may be manufactured with the etching mask film remaining on the light shielding film by providing an antireflection function to the etching mask film.

In (1) to (3) above, an etching stopper film having etching durability to the light shielding film and the light-semitransmissive film may be provided between the substrate and the light shielding film or between the light-semitransmissive film and the light shielding film. The etching stopper film may be made of a material capable of simultaneously peeling off the etching mask film in etching the etching stopper film.

The method of manufacturing a mask blank according to the first aspect of the disclosure includes providing a thin film for pattern formation on one main surface of the mask blank substrate manufactured by the above-described method for manufacturing a mask blank substrate. In particular, the method of manufacturing a mask blank according to the first aspect of the disclosure includes the additional providing of a thin film for pattern formation on one main surface of a high-end mask blank substrate selected in block S10 in the flow chart for the method of manufacturing a mask blank substrate according to the first aspect (FIG. 1) or in the flow chart for the method for manufacturing a mask blank substrate according to the second aspect (FIG. 2). The mask blank manufactured by the method for manufacturing a mask blank according to the first aspect can provide the effect similar to the mask blank according to the first aspect described above. The other matters regarding the method for manufacturing a mask blank according to the first aspect are similar to those of the mask blank according to the first aspect described above.

As a mask blank according to the second aspect of the disclosure, there is provided a mask blank including a thin film for pattern formation on one of two opposite main surfaces of a substrate, characterized in that: when the shape fitting between a virtual surface shape and a composite surface shape obtained by composing a surface shape of the thin film and a surface shape of the other main surface is performed in a calculation region inside a circle 104 mm in diameter based on the center of the substrate to obtain differential data, a difference between the maximum height and the minimum height within the calculation region in the differential data is 25 nm or less; and the virtual surface shape has a shape defined by a Zernike polynomial expressed in a polar coordinate system, wherein the Zernike polynomial is composed of only terms in which the order of variables related to a radius is second or lower order and includes one or more terms in which the order of the variables related to a radius is second-order.

The mask blank according to the second aspect differs from the above-described mask blank according to the first aspect in that the composite surface shape is generated from the surface shape of the thin film for pattern formation and the surface shape of the other main surface to perform the shape fitting of the virtual surface shape to the composite surface shape. The composite surface shape may be obtained by adding together the surface shape of the thin film that is an in-plane distribution of height from a reference surface (fifth reference surface) acting as a reference for the surface shape of the thin film for pattern formation to a surface of the thin film, and the surface shape of the other main surface that is the in-plane distribution of height from the reference surface (second reference surface) acting as a reference for the surface shape of the other main surface to the other main surface.

As above, the surface shape of the thin film for pattern formation is significantly influenced by a tendency of the surface shape of the one main surface thereunder. Also, the thin film for pattern formation has high in-plane uniformity of film thickness. Moreover, even if the reference surface (first reference surface) that acts as a reference for the surface shape of the one main surface differs from the reference surface (fifth reference surface) that acts as a reference for the surface shape of the thin film for pattern formation, the tilt component between the two reference surfaces can be easily corrected by the wavefront correction function as described above. From the above, it would be possible to define the substrate having a surface shape which can also be easily corrected by the wavefront correction function of the exposure apparatus if the composite surface shape generated from the surface shape of the thin film for pattern formation and the surface shape of the other main surface is used. The other matters regarding the mask blank according to the second aspect are similar to those of the mask blank according to the first aspect described above.

As a method of manufacturing a mask blank according to the second aspect of the disclosure, there is provided a method for manufacturing a mask blank including a thin film for pattern formation on one of two opposite main surfaces of a substrate, characterized in that the method includes: preparing a substrate having a thin film for pattern formation on one main surface; performing the shape fitting between a virtual surface shape and a composite surface shape obtained by composing a surface shape of the thin film and a surface shape of the other main surface in a calculation region inside a circle 104 mm in diameter based on the center of the substrate to obtain differential data; and selecting, as a mask blank, the substrate in which a difference between the maximum height and the minimum height within the calculation region in the differential data is 25 nm or less; and the virtual surface shape has a shape defined by a Zernike polynomial expressed in a polar coordinate system, wherein the Zernike polynomial is composed of only terms in which the order of variables related to a radius is second or lower order and includes one or more terms in which the order of the variables related to a radius is second-order.

This method of manufacturing a mask blank according to the second aspect differs from the method of manufacturing a mask blank according to the first aspect described above in that a substrate with a thin film for pattern formation provided on its one main surface is prepared, and the composite surface shape is generated from the surface shape of the thin film and the surface shape of the other main surface to perform the shape fitting of the virtual surface shape to the composite surface shape. The composite surface shape may be obtained by adding together the surface shape of the thin film that is the in-plane distribution of height from the reference surface (fifth reference surface) acting as a reference for the surface shape of the thin film for pattern formation to a surface of the thin film, and the surface shape of the other main surface that is the in-plane distribution of height from the reference surface (second reference surface) acting as a reference for the surface shape of the other main surface to the other main surface.

The method of manufacturing a mask blank according to the second aspect is specifically described below with reference to the flow chart for the method for manufacturing a mask blank substrate according to the first aspect (FIG. 1) or the flow chart for the method for manufacturing a mask blank substrate according to the second aspect (FIG. 2). The substrate with its front and back main surfaces being mirror finished after block S3 is subjected to the block of providing a thin film for pattern formation on one main surface. Subsequently, in block S4, instead of measuring the surface shapes of the front and back main surfaces of the substrate, the surface shape of the thin film and the surface shape of the other main surface are measured. That is, the surface shape of the thin film that is the in-plane distribution of height from the reference surface (fifth reference surface) acting as a reference for the surface shape of the thin film for pattern formation to a surface of the thin film, and the surface shape of the other main surface that is the in-plane distribution of height from the reference surface (second reference surface) acting as a reference for the surface shape of the other main surface to the other main surface are measured. Then, in block S5, the surface shape of the thin film and the surface shape of the other main surface are composed to generate the composite surface shape. Block S6 and the subsequent blocks are similar to those of the respective flow charts in FIGS. 1 and 2.

The mask blank manufactured by the method of manufacturing a mask blank according to the second aspect can provide an effect similar to the mask blank manufactured by the method for manufacturing a mask blank according to the first aspect described above. The other matters regarding the method of manufacturing a mask blank according to the second aspect are similar to those of the method of manufacturing a mask blank according to the first aspect described above.

As a mask blank according to the third aspect of the disclosure, there is provided a mask blank including a thin film for transfer pattern formation on one of two opposite main surfaces of a substrate and a conductive film on the other main surface, characterized in that: when the shape fitting between a virtual surface shape and a composite surface shape obtained by composing a surface shape of the thin film and a surface shape of the conductive film is performed in a calculation region inside a circle 104 mm in diameter based on the center of the substrate to obtain differential data, a difference between the maximum height and the minimum height within the calculation region in the differential data is 25 nm or less; and the virtual surface shape has a shape defined by a Zernike polynomial expressed in a polar coordinate system, wherein the Zernike polynomial is composed of only terms in which the order of variables related to a radius is second or lower order and includes one or more terms in which the order of the variables related to a radius is second-order.

The mask blank according to the third aspect differs from the above-described mask blank according to the first aspect in that the composite surface shape is generated from the surface shape of the thin film and the surface shape of the conductive film to perform the shape fitting of the virtual surface shape to the composite surface shape. The composite surface shape may be obtained by adding together the surface shape of the thin film that is the in-plane distribution of height from the reference surface (fifth reference surface) acting as a reference for the surface shape of the thin film for pattern formation to the surface of the thin film, and the surface shape of the conductive film that is the in-plane distribution of height from the reference surface (fourth reference surface) acting as a reference for the surface shape of the conductive film to the surface of the conductive film. The mask blank according to the third aspect may have, between the one main surface of the substrate and the thin film for pattern formation, a multi-layer reflective film which functions to reflect the exposure light.

As above, the surface shape of the thin film for pattern formation is influenced by a tendency of the surface shape of the one main surface thereunder (which also applies to the configuration wherein the multi-layer reflective film is provided between the thin film for pattern formation and the substrate), and the surface shape of the conductive film is influenced by a tendency of the surface shape of the other main surface thereunder. Both the thin film and conductive film have high in-plane uniformity of film thickness. Moreover, even if the reference surface (first reference surface) that acts as a reference for the surface shape of one main surface differs from the reference surface (fifth reference surface) that acts as a reference for the surface shape of the thin film, the tilt component between the two reference surfaces can be easily corrected by the wavefront correction function as described above. This also applies to the reference surface (second reference surface) that acts as a reference for the surface shape of the other main surface and the reference surface (fourth reference surface) that acts as a reference for the surface shape of the conductive film. From the above, it would be possible to define the substrate having a surface shape which can also be easily corrected by the wavefront correction function of the exposure apparatus if the composite surface shape generated from the surface shape of the thin film and the surface shape of the conductive film is used.

If the mask blank according to the third aspect is a reflective mask blank which specifically includes a multi-layer reflective film between the substrate and the thin film for pattern formation, a material having high absorbance of the EUV light is used as a material for forming the thin film for pattern formation (absorber film). For example, such a material is preferably Ta (tantalum) simple substance, or a material containing Ta as a major component. The material containing Ta as a major component is generally an alloy of Ta. The crystal condition of such an absorber film preferably has an amorphous or microcrystalline structure in terms of smoothness and flatness. For example, a material containing Ta and B, a material containing Ta and N, a material containing Ta and B and further containing at least one of O and N, a material containing Ta and Si, a material containing Ta, Si, and N, a material containing Ta and Ge, a material containing Ta, Ge, and N, and the like may be used as the material containing Ta as a major component. Addition of B, Si, Ge, etc. to Ta allows the amorphous structure to be easily obtained and can improve the smoothness. Further, addition of N, O to Ta, which improves the resistance to oxidation, can improve the stability over time.

The other matters regarding the mask blank according to the third aspect are similar to those of the mask blank according to the first aspect described above. Also, matters regarding the multi-layer reflective film and conductive film are similar to those of the multi-layer reflective film coated substrate according to the first aspect described above.

As a method of manufacturing a mask blank according to the third aspect of the disclosure, there is provided a method of manufacturing a mask blank including a thin film for pattern formation on one of two opposite main surfaces of a substrate and a conductive film on the other main surface, characterized in that the method includes preparing a substrate including a thin film for pattern formation on one main surface and a conductive film on the other main surface; performing the shape fitting between a virtual surface shape and a composite surface shape obtained by composing a surface shape of the thin film and a surface shape of the conductive film in a calculation region inside a circle 104 mm in diameter based on the center of the substrate to obtain differential data; and selecting, as a mask blank, the substrate in which a difference between the maximum height and the minimum height within the calculation region in the differential data is 25 nm or less; the virtual surface shape has a shape defined by a Zernike polynomial expressed in a polar coordinate system, wherein the Zernike polynomial is composed of only terms in which the order of variables related to a radius is second or lower order and includes one or more terms in which the order of the variables related to a radius is second-order.

The method of manufacturing a mask blank according to the third aspect differs from the method of manufacturing a mask blank according to the first aspect described above in that the substrate is prepared to have the thin film for pattern formation on one main surface and the conductive film on the other main surface, and the composite surface shape is generated from the surface shape of the thin film and the surface shape of the conductive film to perform the shape fitting of the virtual surface shape to the composite surface shape. The composite surface shape is obtained by adding together the surface shape of the thin film that is the in-plane distribution of height from the reference surface (fifth reference surface) acting as a reference for the surface shape of the thin film for pattern formation to the surface of the thin film, and the surface shape of the conductive film that is the in-plane distribution of height from the reference surface (fourth reference surface) acting as a reference for the surface shape of the conductive film to the surface of the conductive film. The method of manufacturing a mask blank according to the third aspect preferably includes providing, between the one main surface of the substrate and the thin film for pattern formation, a multi-layer reflective film which functions to reflect the exposure light.

The method of manufacturing a mask blank according to the third aspect is specifically described below with reference to the flow chart for the method of manufacturing a mask blank substrate according to the first aspect (FIG. 1) or the flow chart for the method for manufacturing a mask blank substrate according to the second aspect (FIG. 2). The substrate with its front and back main surfaces being mirror finished after block S3 is subjected to providing the thin film for pattern formation on the one main surface (and optionally the step of forming a multi-layer reflective film, prior thereto) and providing the conductive film on the other main surface. Even if the order of providing the thin film and providing the conductive film is inverted, there is no particular influence on the effect of the present disclosure. Subsequently, in block S4, instead of measuring the surface shapes of the front and back main surfaces of the substrate, the surface shape of the thin film and the surface shape of the conductive film are measured. That is, the surface shape of the thin film that is the in-plane distribution of height from the reference surface (fifth reference surface) acting as a reference for the surface shape of the thin film for pattern formation to the surface of the thin film, and the surface shape of the conductive film that is the in-plane distribution of height from the reference surface (fourth reference surface) acting as a reference for the surface shape of the conductive film to the surface of the conductive film are measured. Then, in block S5, the surface shape of the thin film and the surface shape of the conductive film are composed to generate the composite surface shape. Block S6 and the subsequent blocks are similar to those of the respective flow charts in FIGS. 1 and 2.

The mask blank manufactured by the method for manufacturing a mask blank according to the third aspect can provide an effect similar to the mask blank according to the third aspect described above. The other matters regarding the method of manufacturing a mask blank according to the third aspect are similar to those of the mask blank according to the third aspect described above.

[Method of Manufacturing a Transfer Mask]

The method of manufacturing a transfer mask of the disclosure is characterized in that it includes the forming of a transfer pattern in the thin film for pattern formation of the mask blank of each aspect above. The method of manufacturing a transfer mask of the present disclosure is also characterized in that it includes the forming of a transfer pattern in the thin film for pattern formation of the mask blank manufactured by the method of manufacturing a mask blank of each aspect above. The process of manufacturing a transfer mask from a mask blank is described below. The mask blank used here is a reflective mask blank which includes a multi-layer reflective film between a substrate and a thin film for pattern formation (absorber film).

First, a resist film is formed on the absorber film (thin film for pattern formation) of the reflective mask blank by a spin coating method. A chemically amplified resist for electron beam exposure drawing is preferably used for the resist film. Next, a transfer pattern to be formed in the absorber film is drawn on the resist film by exposure with electron beams, and a predetermined process such as development is conducted, thereby forming a resist pattern having the transfer pattern. Then, the dry etching of the absorber film is performed using the resist pattern as a mask to form the transfer pattern in the absorber film. Thereafter, the resist pattern is removed, and a predetermined cleaning process, etc. is conducted, so that the reflective mask (transfer mask) is obtained.

In the reflective mask manufactured by this method, a surface where the multi-layer reflective film is exposed upon electrostatic chucking to the mask stage of the exposure apparatus has a surface shape which can be easily corrected by the wavefront correction function of the exposure apparatus. Thus, when the reflective mask is used for exposure transfer to a transfer target object (such as a resist film on a semiconductor wafer) by the exposure apparatus, the control of an equivalent wavefront of the reflected exposure light (EUV light) from the multi-layer reflective film by the wavefront correction function can provide high transfer accuracy. Therefore, when this reflective mask (transfer mask) is used in the exposure, a focal depth, position displacement, and resolution become outstanding, and circuit characteristics of a semiconductor device manufactured therefrom are also stabilized. The present disclosure is effective irrespective of the types of transfer masks, that is, effective for a binary mask, halftone type phase shift mask, enhancer-type mask, Levenson phase shift mask, and CPL mask.

[Method of Manufacturing a Semiconductor Device]

The method of manufacturing a semiconductor device of the present disclosure is characterized in that the transfer mask of each aspect above is placed on the mask stage of the exposure apparatus, so that the transfer pattern of the transfer mask is transferred onto a semiconductor substrate by a lithography method. Further, the method of manufacturing a semiconductor device of the present disclosure is characterized in that the transfer mask manufactured by the method of manufacturing a transfer mask according to each aspect above is placed on the mask stage of the exposure apparatus, so that a transfer pattern of the transfer mask is transferred onto a semiconductor substrate by a lithography method.

The transfer mask used in these manufacturing methods has a shape such that the thickness variation of the substrate can be easily controlled by the wavefront correction function. Thus, when this transfer mask is used for exposure transfer to the transfer target object (such as a resist film on a semiconductor wafer) by the exposure apparatus, the control of an equivalent wavefront of the exposure light by the wavefront correction function can provide high transfer accuracy. Therefore, the circuit pattern transferred by exposure using this transfer mask is highly accurate, and as a result, the circuit characteristics of the semiconductor device are also stabilized. The method of manufacturing a semiconductor device of the present disclosure is effective irrespective of the types of transfer masks, that is, effective for a binary mask, halftone type phase shift mask, enhancer-type mask, Levenson phase shift mask, and CPL mask. Since the reflective mask is electrostatically chucked on its backside (conductive film) upon the placement on the mask stage of the exposure apparatus, the thickness variation has a profound effect on the accuracy of exposure transfer, which is especially effective.

EXAMPLES

Examples and Comparative Examples

Examples and Comparative Examples regarding the mask blank substrate, mask blank, and transfer mask of the present disclosure are described below.

[Manufacture of a Mask Blank Substrate]

Here, the method for manufacturing a mask blank according to the present invention was used to manufacture four mask blank substrates (substrate A and substrate B of Examples, and substrate X and substrate Y of Comparative Examples). First, four glass substrates (substrates A, B, X, Y) (size: 152.4 mm×152.4 mm, thickness: 6.35 mm) were cut out from a $SiO_2$—$TiO_2$ glass ingot (block S1), and end faces of these glass substrates were chamfered and ground, and further roughly polished and precisely polished with a polishing solution containing cerium oxide abrasive grains. Then, the four glass substrates were placed in a carrier of a double-side polishing device, and superprecision polishing was conducted under the conditions below (Step S2).

Polishing pad: soft polisher (suede type)
Polishing solution: colloidal silica abrasive grains (average particle size: 100 nm) and water
Processing pressure: 50 to 100 g/cm$^2$
Processing time: 60 minutes After the superprecision polishing, each glass substrate was immersed in a dilute hydrofluoric acid solution for cleaning to remove the colloidal silica abrasive grains.

Subsequently, the main surfaces and the end faces of each glass substrate were scrub-cleaned, followed by spin-cleaning with pure water, and spin-drying. Thereafter, the surface shapes of the respective front and back main surfaces of the four glass substrates were measured using a surface shape measuring apparatus (UltraFlat200M manufactured by Corning Tropel Corp.). Based on measured results, processing conditions of local processing to be conducted on the front and back main surfaces of each glass substrate (such as a requisite removal amount) were calculated.

Next, based on the processing conditions calculated in the previous step, a local processing apparatus was used to conduct the local processing on the front and back main surfaces of each glass substrate (block S3). The local processing apparatus used here was an apparatus utilizing Magneto Rheological Finishing (MRF) processing method. The magnetorheological fluid used here contained an iron component, the polishing slurry was an alkali aqueous solution plus a polishing agent (about 2 wt %), and the polishing agent was cerium oxide. Each glass substrate after the local processing was immersed in a cleaning tank containing a hydrochloric acid aqueous solution at a concentration of about 10% (temperature: about 25° C.) therein for about 10 minutes, and then rinsed with pure water and dried with isopropyl alcohol (IPA).

Further, the front and back surfaces of each glass substrate were subjected to double-sided polishing by a double-side polishing device under the polishing conditions for maintaining or improving the surface shapes of the substrate surfaces. The final polishing was conducted under the following polishing conditions:

Processing liquid: alkali aqueous solution (NaOH)+polishing agent (concentration: about 2 wt %)

Polishing agent: colloidal silica, with the average particle size of about 70 nm Revolving speed of a polishing surface plate: about 1 to 50 rpm Processing pressure: about 0.1 to 10 kPa Polishing time: about 1 to 10 minutes Then, each glass substrate was washed with an alkali aqueous solution (NaOH).

Figure 3A:
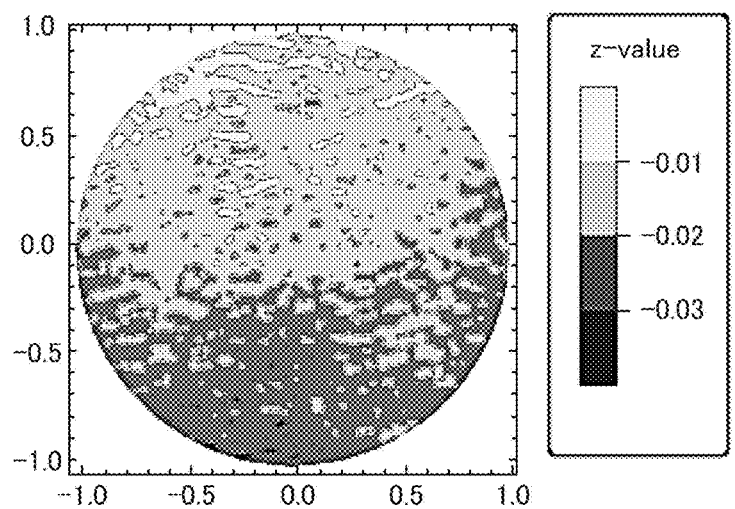
FIG. 3(a) is a contour distribution map for the mask blank substrate according to Example 1, in particular, a contour distribution map showing a composite surface shape within a 104 mm diameter.
Figure 4A:
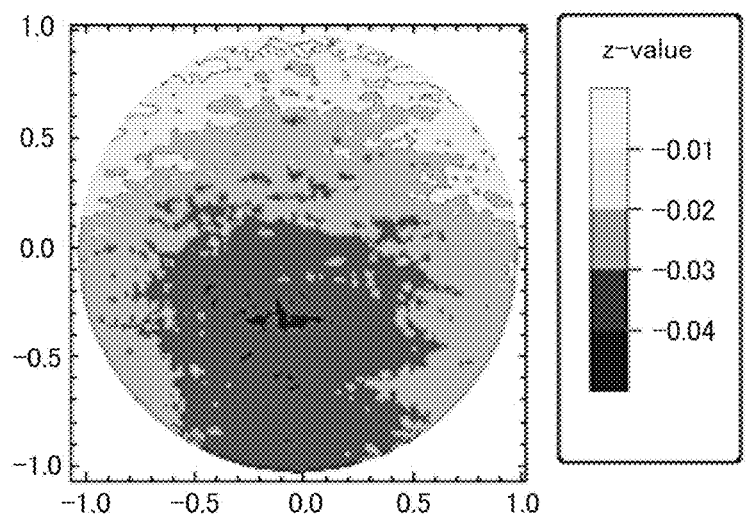
FIG. 4(a) is a contour distribution map for the mask blank substrate according to Example 2, in particular, a contour distribution map showing a composite surface shape within a 104 mm diameter.
Figure 5A:
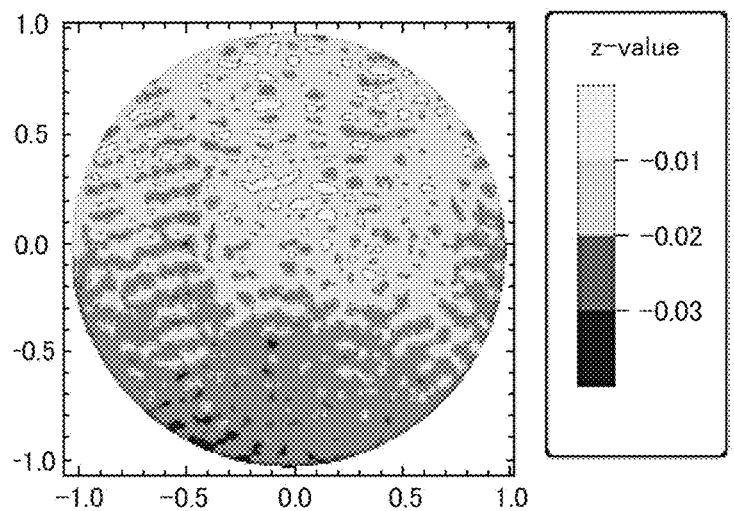
FIG. 5(a) is a contour distribution map for the mask blank substrate according to Comparative Example 1, in particular, a contour distribution map showing a composite surface shape within a 104 mm diameter.
Figure 6A:
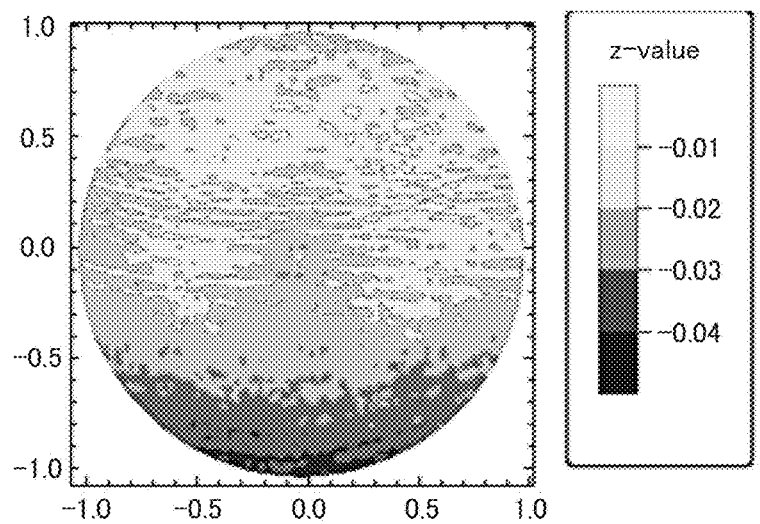
FIG. 6(a) is a contour distribution map for the mask blank substrate according to Comparative Example 2, in particular, a contour distribution map showing a composite surface shape within a 104 mm diameter.

Each glass substrate (substrates A, B, X, Y) after washing was measured for the surface shapes of its front and back main surfaces by the surface shape measuring apparatus (UltraFlat200M manufactured by Corning Tropel Corp.) (block S4). Subsequently, a measured result of the surface shape of the front main surface and a measured result of the surface shape of the back main surface in each glass substrate were composed to derive the composite surface shape (block S5). The contour distribution map for the composite surface shape of substrate A is shown in FIG. 3(a); the contour distribution map for the composite surface shape of substrate B is shown in FIG. 4(a); the contour distribution map for the composite surface shape of substrate X is shown in FIG. 5(a); and the contour distribution map for the composite surface shape of substrate Y is shown in FIG. 6(a). The contour distribution map for each composite surface shape is in an inner region inside a circle 104 mm in diameter based on the center of the substrate. Contours in these contour distribution maps are drawn in increments of 10 nm (the highest point is zero, with negative values increasing in increments of 0.01 μm).

From the composite surface shape of each glass substrate, a PV value (PV0) which was a difference between the maximum height and the minimum height in an inner region within a square shape having a side of 132 mm based on the center of the substrate was calculated (block S12). Further, the selection step was performed based on a criterion value of 90 nm or less for the calculated PV value (PV0) in each glass substrate (block S13). As a result, the PV value (PV0) of substrate A was 90 nm; the PV value (PV0) of substrate B was 60 nm; and the PV value (PV0) of substrate Y was 61 nm, all of which satisfied the criterion of 90 nm or less. However, the PV value (PV0) of substrate X was 99 nm, and did not satisfy the criterion of 90 nm or less. Since substrate X is not applicable as a high-end mask blank substrate, it is to be used as a middle-to-low-end mask blank substrate, returned to Step S2 or Step S3, or discarded (block S11).

Figure 3B:
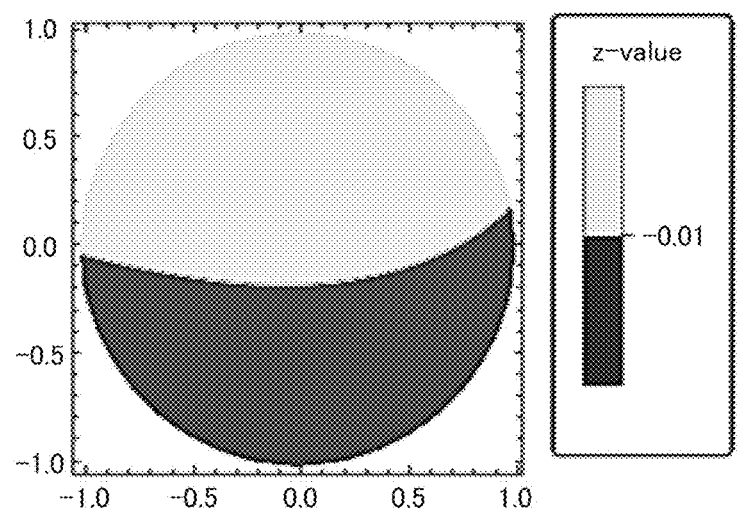
FIG. 3(b) is a contour distribution map for the mask blank substrate according to Example 1, in particular, a contour distribution map showing a virtual surface shape corresponding to the composite surface shape within a 104 mm diameter.
Figure 4B:
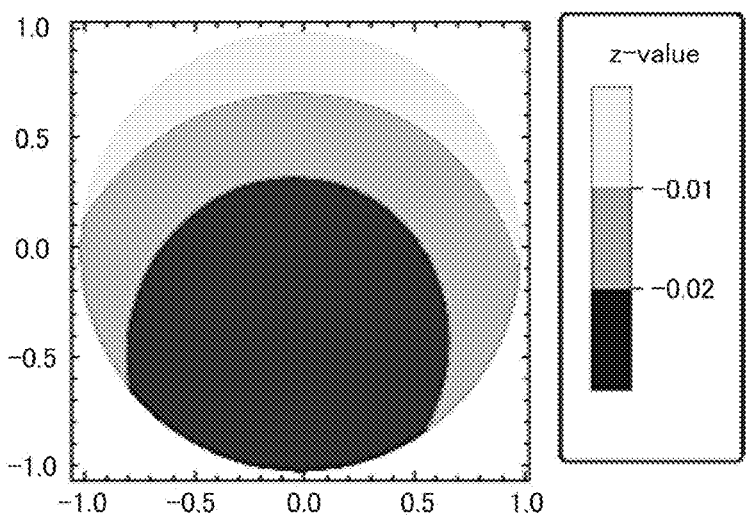
FIG. 4(b) is a contour distribution map for the mask blank substrate according to Example 2, in particular, a contour distribution map showing a virtual surface shape corresponding to the composite surface shape within a 104 mm diameter.
Figure 5B:
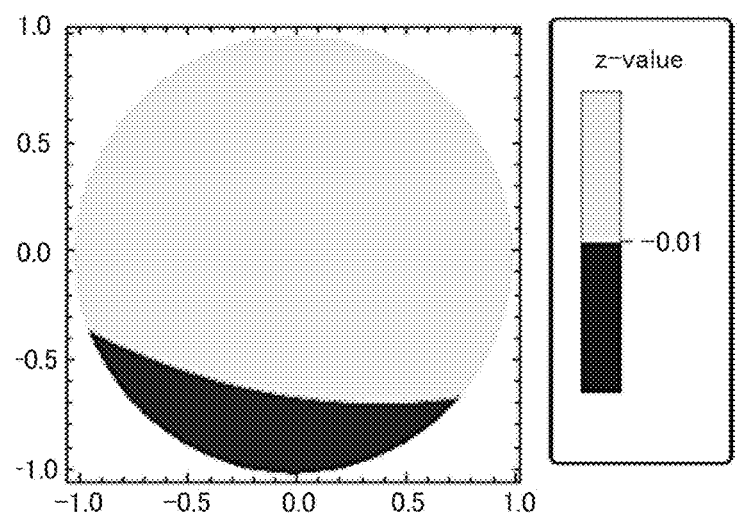
FIG. 5(b) is a contour distribution map for the mask blank substrate according to Comparative Example 1, in particular, a contour distribution map showing a virtual surface shape corresponding to the composite surface shape within a 104 mm diameter.
Figure 6B:
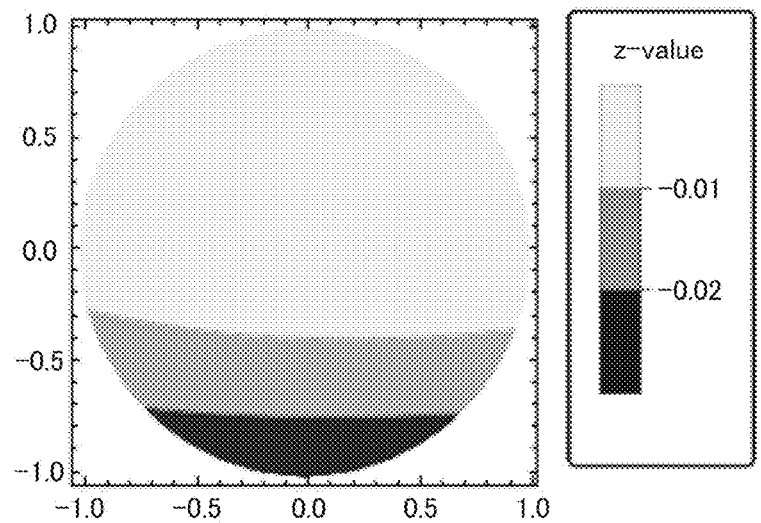
FIG. 6(b) is a contour distribution map for the mask blank substrate according to Comparative Example 2, in particular, a contour distribution map showing a virtual surface shape corresponding to the composite surface shape within a 104 mm diameter.

Next, for each of substrates A, B, and Y which satisfied the criterion at block S13, the virtual surface shape for the shape fitting was calculated based on each composite surface shape (block S6). The contour distribution map of the virtual surface shape corresponding to substrate A is shown in FIG. 3(b); the contour distribution map of the virtual surface shape corresponding to substrate B is shown in FIG. 4(b); and the contour distribution map of the virtual surface shape corresponding to substrate Y is shown in FIG. 6(b). For reference, the contour distribution map of the virtual surface shape corresponding to substrate X is shown in FIG. 5(b), though it has already been recognized as unacceptable as the mask blank substrate of the present disclosure. The contour distribution map of each composite surface shape is in an inner region inside a circle 104 mm in diameter based on the center of the substrate. Contours in these contour distribution maps are drawn in increments of 10 nm (the highest point is zero, with negative values increasing in increments of 0.01 μm).

Each virtual surface shape is defined by a Zernike polynomial which is composed of only terms in which the order of variables related to a radius is second or lower order and includes one or more terms in which the order of the variables related to a radius is second-order. The Zernike polynomial used here is described in The University of Arizona style, and the fitting was made using the first to sixth terms for approximation to the actually measured shape to create a virtual reference surface. The terms of the Zernike polynomial described in The University of Arizona style used in Examples, etc. are as shown in Table 1. Each term is described in a polar coordinate system in which the radius is $\rho$ and the phase (azimuth) is $\theta$. In Table 1, j represents the number of a term ($j^{th}$ term), and $Z_j(\rho,\theta)$ is the content of the term of the number. While Table 1 includes up to the tenth term for reference, terms up to the sixth term are used in Examples, etc.

TABLE 1

| j | n | m | $Z_j(\rho, \theta)$ |
|---|---|---|---|
| 1 | 0 | 0 | 1 |
| 2 | 1 | 1 | $2\rho \cos \theta$ |
| 3 | 1 | 1 | $2\rho \sin \theta$ |
| 4 | 2 | 0 | $\sqrt{3}(2\rho^2 - 1)$ |
| 5 | 2 | 2 | $\sqrt{6}\rho^2 \sin 2\theta$ |
| 6 | 2 | 2 | $\sqrt{6}\rho^2 \cos 2\theta$ |
| 7 | 3 | 1 | $\sqrt{8}(3\rho^3 - 2\rho) \sin 2\theta$ |
| 8 | 3 | 1 | $\sqrt{8}(3\rho^3 - 2\rho) \cos 2\theta$ |
| 9 | 3 | 3 | $\sqrt{8}\rho^3 \sin 3\theta$ |
| 10 | 3 | 3 | $\sqrt{8}\rho^3 \cos 3\theta$ |

Figure 3C:
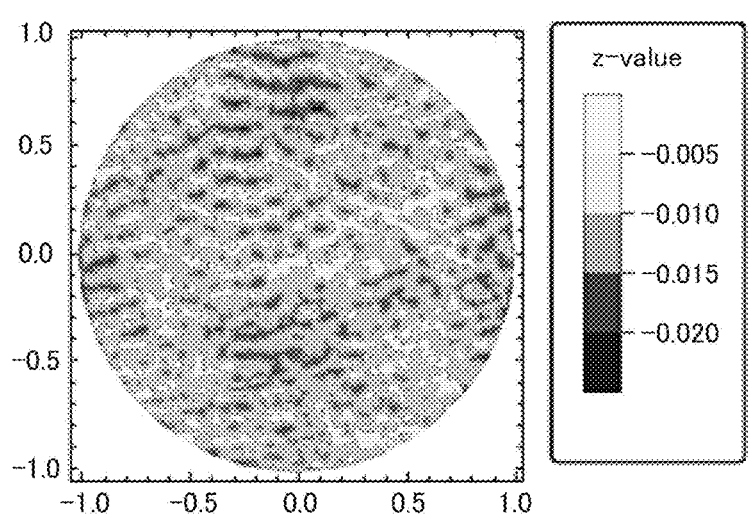
FIG. 3(c) is a contour distribution map for the mask blank substrate according to Example 1, in particular, a contour distribution map of a difference shape that is a difference between the composite surface shape and the virtual surface shape.
Figure 4C:
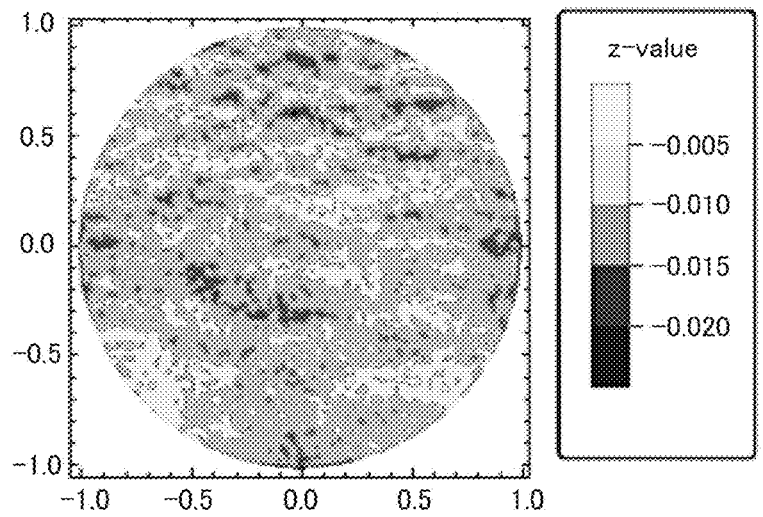
FIG. 4(c) is a contour distribution map for the mask blank substrate according to Example 2, in particular, a contour distribution map of a difference shape that is a difference between the composite surface shape and the virtual surface shape.
Figure 5C:
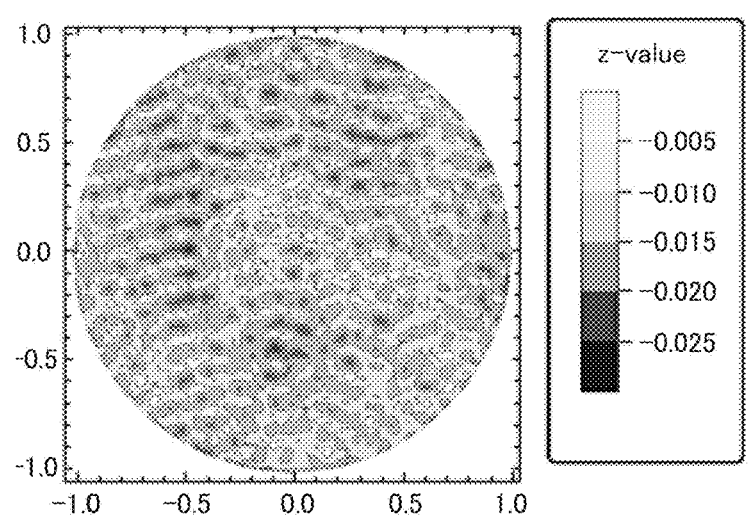
FIG. 5(c) is a contour distribution map for the mask blank substrate according to Comparative Example 1, in particular, a contour distribution map of a difference shape that is a difference between the composite surface shape and the virtual surface shape.
Figure 6C:
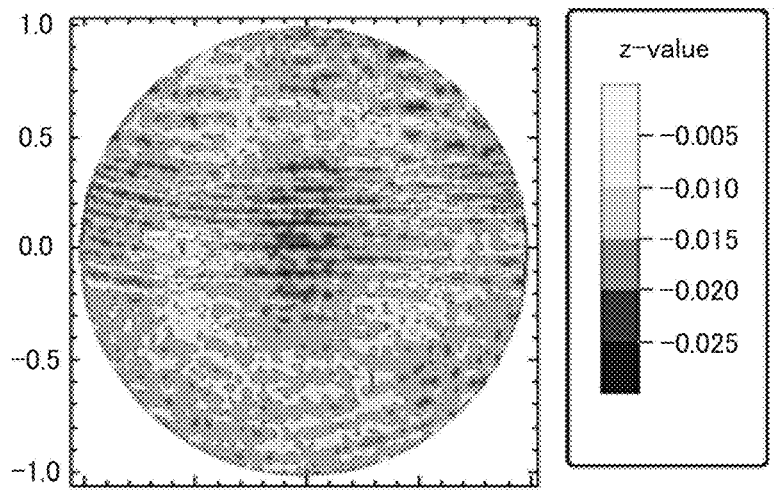
FIG. 6(c) is a contour distribution map for the mask blank substrate according to Comparative Example 2, in particular, a contour distribution map of a difference shape that is a difference between the composite surface shape and the virtual surface shape.

Next, on each of the composite surface shapes of glass substrates A, B, and Y, the shape fitting with the corresponding virtual surface shape calculated in block S6 was performed, thereby calculating the difference shape (differential data) (block S7). The contour distribution map of the difference shape (differential data) that is a result of the shape fitting for substrate A is shown in FIG. 3(c); the contour distribution map of the difference shape (differential data) that is a result of the shape fitting for substrate B is shown in FIG. 4(c); and the contour distribution map of the difference shape (differential data) that is a result of the shape fitting for substrate Y is shown in FIG. 6(c). For reference, the contour distribution map of the difference shape (differential data) that is a result of the shape fitting for substrate X is shown in FIG. 5(c), though it has already been recognized as unacceptable as the mask blank substrate of the present disclosure. The contour distribution map of each difference shape is in an inner region inside a circle 104 mm in diameter based on the center of the substrate. Contours in these contour distribution maps are drawn in increments of 5 nm (the highest point is zero, with negative values increasing in increments of 0.005 μm).

Then, from the difference shape (differential data) of each of glass substrates A, B, and Y, the PV value (PV1), which is a difference between the maximum height and the minimum height in a region of a circle 104 mm in diameter based on the center of the substrate, was calculated (block S8). As a result, the PV value (PV1) of substrate A was 21 nm; the PV value (PV1) of substrate B was 20 nm; and the PV value (PV1) of substrate Y was 27 nm. Also, the PV value (PV1) of substrate X calculated for reference was 28 nm. On each glass substrate, the selection step was performed to determine acceptance based on a criterion value of 25 nm or less for the PV value (PV1) (block S9). Both substrates A and B had the PV value (PV1) of 25 nm or less, and satisfied the criterion. Thus, substrates A and B are to be selected as high-end mask blank substrates (block S10). However, substrates X and Y had the PV value (PV1) of greater than 25 nm, and did not satisfy the criterion. Since substrates X and Y are not applicable as high-end mask blank substrates (substrate X, which does not also satisfy the criterion for PV0, is originally inapplicable), they are to be used as middle-to-low-end mask blank substrates, returned to block S2 or block S3, or discarded (block S11).

[Manufacture of a Multi-Layer Reflective Film Coated Substrate]

Substrates A and B of Examples selected as high-end mask blank substrates and substrates X and Y of Comparative Examples regarded as inapplicable as high-end mask blank substrates were used to manufacture multi-layer reflective film coated substrates A and B of Examples and multi-layer reflective film coated substrates X and Y of Comparative Examples, respectively. The process of manufacturing the multi-layer reflective film coated substrate A from substrate A of Example is described below.

In particular, on one main surface of substrate A of Example, the ion beam sputtering method was applied to form forty pairs of a Si film having a thickness of 4.2 nm and a Mo film having a thickness of 2.8 nm (total thickness: 280 nm), and to further form a protective layer made of Ru and having a thickness of 2.5 nm, thereby forming a multi-layer reflective film. The multi-layer reflective film was formed by the ion beam sputtering method such that the incidence angles of sputtering particles in the Si film and sputtering particles in the Mo Film are 5 degrees and 65 degrees, respectively, relative to a normal of the substrate main surface.

Then, on the other main surface of substrate A having the multi-layer reflective film, the reactive sputtering with a DC power source was conducted using a Cr target and under Ar+$N_2$ gas (Ar:$N_2$=90%:10%) atmosphere to form a conductive film made of CrN (Cr: 90 at %, N: 10 at %) and having a thickness of 20 nm. The above process provided multi-layer reflective film coated substrate A of Example, which included the multi-layer reflective film on the one main surface of the substrate and the conductive film on the other main surface. Further, similar processes were applied to substrate B of Example and substrates X and Y of Comparative Examples to manufacture multi-layer reflective film coated substrate B of Example, and multi-layer reflective film coated substrates X and Y of Comparative Examples, respectively.

For each of multi-layer reflective film coated substrates A, B, X, and Y finished, the surface shape of the multi-layer reflective film and the surface shape of the conductive film were measured by the surface shape measuring apparatus (UltraFlat200M manufactured by Corning Tropel Corp.). Then, the composite surface shape was generated from the surface shape of each multi-layer reflective film and the surface shape of each conductive film, which were measured results, in a way similar to the manufacture process of the mask blank substrate described above. Subsequently, based on each composite surface shape, the virtual surface shape for the shape fitting was calculated. Then, the shape fitting between each composite surface shape and corresponding virtual surface shape was performed to calculate the difference shape. The PV value was further calculated from each difference shape.

The PV value of the difference shape calculated for each of multi-layer reflective film coated substrates A, B, X, and Y was rarely different from the PV value (PV1) of the difference shape calculated in the manufacture process of the mask blank substrate. Further, when each PV value of the difference shape for each of multi-layer reflective film coated substrates A, B, X, and Y was used for selection based on the criterion value for PV0, the selection result was similar to the result of the mask blank substrate selection (while multi-layer reflective film coated substrates A and B were acceptable, multi-layer reflective film coated substrates X and Y were not acceptable). From the above, it was found that the film stress in the multi-layer reflective film and conductive film had a low impact on the selection of the multi-layer reflective film coated substrate of the present invention.

[Manufacture of a Mask Blank]

Multi-layer reflective film coated substrates A and B of Examples which were high-end multi-layer reflective film coated substrates, and multi-layer reflective film coated substrates X and Y of Comparative Examples which were inapplicable as high-end multi-layer reflective film coated substrates were used to manufacture mask blanks A and B of Examples and mask blanks X and Y of Comparative Examples, respectively. The process for manufacturing mask blank A from multi-layer reflective film coated substrate A of Example is described below.

In particular, on the multi-layer reflective film (protective layer) of substrate A of Example, the reactive sputtering with a DC power source was conducted using a TaB target (Ta:B=80 at %:20 at %) and under Xe+$N_2$ gas (flow ratio of Xe:$N_2$=90%:10%) atmosphere to form an absorber film (thin film for pattern formation) made of TaBN (Ta: 80 at %, B: 10 at %, N: 10 at %) and having a thickness of 65 nm. The above process produced mask blank (reflective mask blank) A of Example, which included a laminated structure of the multi-layer reflective film and absorber film on one main surface of the substrate and the conductive film on the other main surface. Similar methods were applied to multi-layer reflective film coated substrate B of Example and multi-layer reflective film coated substrates X and Y of Comparative Examples, thereby manufacturing mask blank B of Example and mask blanks X and Y of Comparative Examples, respectively.

Each of finished mask blanks A, B, X, and Y was measured for the surface shape of the absorber film and the surface shape of the conductive film by the surface shape measuring apparatus (UltraFlat200M manufactured by Corning Tropel Corp.). Subsequently, the composite surface shape was generated from the surface shape of each absorber film and the surface shape of each conductive film, which were measured results, in a way similar to the manufacturing process of the mask blank substrate described above. Then, based on each composite surface shape, the virtual surface shape for the shape fitting was calculated. Then, the shape fitting between each composite surface shape and corresponding virtual surface shape was performed to calculate the difference shape. The PV value was further calculated from each difference shape. The PV value of the difference shape calculated for each of mask blanks A, B, X, and Y was rarely different from the PV value (PV1) of the difference shape calculated in the manufacture process of the mask blank substrate. Further, when each PV value of the difference shape for each of mask blanks A, B, X, and Y was used for selection based on the criterion value for PV0, the selection result was similar to the result of the mask blank substrate selection (while mask blanks A and B were acceptable, mask blanks X and Y were not acceptable). From the above, it was found that the film stress in the multi-layer reflective film, absorber film, and conductive film had a low impact on the selection of the mask blank of the present invention.

[Manufacture of a Transfer Mask and Manufacture of a Semiconductor Device]

Here, mask blanks A and B of Examples which were high-end mask blanks, and mask blanks X and Y of Comparative Examples which were inapplicable as high-end mask blanks were used to manufacture transfer masks (reflective masks) A and B of Examples and transfer masks (reflective masks) X and Y of Comparative Examples, respectively. Since the manufacturing process of the transfer mask is similar to the method described in the above section [Transfer mask and its manufacturing method], its explanation is omitted.

In each of manufactured transfer masks A and B of Examples, a surface where the multi-layer reflective film is exposed upon electrostatic chucking to the mask stage of the exposure apparatus has a surface shape which can be easily corrected by the wavefront correction function of the exposure apparatus. Thus, it was confirmed that when the transfer mask is used for exposure transfer to a resist film on a semiconductor wafer by the exposure apparatus, the control of an equivalent wavefront of the reflected EUV light from the multi-layer reflective film by the wavefront correction function could provide high transfer accuracy. It was also confirmed that when this transfer mask is used in the exposure, a focal depth, position displacement, and resolution become outstanding, and circuit characteristics of a semiconductor device manufactured therefrom are also stabilized.

In each of transfer masks X and Y of Comparative Examples, a surface where the multi-layer reflective film is exposed upon electrostatic chucking to the mask stage of the exposure apparatus has a surface shape which hardly provides the effect of correction by the wavefront correction function of the exposure apparatus.

Therefore, it was confirmed that when this transfer mask is used for exposure transfer to a resist film on a semiconductor wafer by the exposure apparatus, it is difficult to control the equivalent wavefront of the reflected EUV light from the multi-layer reflective film by the wavefront correction function, and thus, high transfer accuracy cannot be achieved. It was also confirmed that when this transfer mask is used in the exposure, deviation in focal depth and the position displacement easily occur, and circuit characteristics of a semiconductor device manufactured therefrom are unstable.

What is claimed is:

1. A mask blank substrate comprising a substrate having a first main surface and a second main surface opposite to the first main surface,
    wherein, within a calculation region inside a circle 104 millimeters in diameter centered on the center of the substrate, a difference between a maximum height and a minimum height of a difference shape does not exceed 25 nanometers,
    wherein the difference shape is a difference between:
        a composite surface shape obtained by composing a surface shape of the first main surface and a surface shape of the second main surface; and
        a virtual surface shape defined by a Zernike polynomial expressed in a polar coordinate system,
    wherein the Zernike polynomial is composed only of terms in which the order of variables related to a radius is second or lower order and includes at least one term in which the order of the variables related to a radius is second-order, and
    wherein a difference, in an inner region of a square shape having a side of 132 millimeters based on the center of the substrate, between a maximum height of the composite surface shape and a minimum height of the composite surface shape is not less than 60 nanometers and does not exceed 90 nanometers.

2. The mask blank substrate according to claim 1, wherein the surface shape of the first main surface is an in-plane distribution of height from a first reference surface to the first main surface, and
    wherein the surface shape of the second main surface is an in-plane distribution of height from a second reference surface to the second main surface, and
    wherein the composite surface shape obtained by composing a surface shape of the first main surface and a surface shape of the second main surface is obtained by adding together the surface shape of the first main surface and the surface shape of the second main surface.

3. The mask blank substrate according to claim 1, comprising a multi-layer reflective film on the first main surface of the substrate,
    wherein the surface shape of the first main surface is an in-plane distribution of height from a first reference surface to a surface of the multi-layer reflective film.

4. The mask blank substrate according to claim 3, comprising a conductive film on the second main surface of the substrate,
    wherein the surface shape of the second main surface is an in-plane distribution of height from a second reference surface to a surface of the conductive film.

5. The mask blank substrate according to claim 4, comprising a thin film for transfer pattern formation on the multi-layer reflective film,
    wherein the surface shape of the first main surface is an in-plane distribution of height from the first reference surface to a surface of the thin film.

6. The mask blank substrate according to claim 3, comprising a thin film for transfer pattern formation on the multi-layer reflective film,
wherein the surface shape of the first main surface is an in-plane distribution of height from the first reference surface to a surface of the thin film.

7. The mask blank substrate according to claim 1, comprising a conductive film on the second main surface of the substrate,
wherein the surface shape of the second main surface is an in-plane distribution of height from a second reference surface to a surface of the conductive film.

8. The mask blank substrate according to claim 1, comprising a thin film for transfer pattern formation on the first main surface of the substrate,
wherein the surface shape of the first main surface is an in-plane distribution of height from a first reference surface to a surface of the thin film.

9. A multi-layer reflective film coated substrate comprising a substrate having a first main surface and a second main surface opposite to the first main surface, a multi-layer reflective film on the first main surface, and a conductive film on the second main surface,
wherein, within a calculation region inside a circle 104 millimeters in diameter centered on the center of the substrate, a difference between a maximum height and a minimum height of a difference shape does not exceed 25 nanometers,
wherein the difference shape is a difference between:
a composite surface shape obtained by composing a surface shape of the multi-layer reflective film and a surface shape of the conductive film; and
a virtual surface shape defined by a Zernike polynomial expressed in a polar coordinate system,
wherein the Zernike polynomial is composed only of terms in which the order of variables related to a radius is second or lower order and includes at least one term in which the order of the variables related to a radius is second-order, and
wherein a difference, in an inner region of a square shape having a side of 132 millimeters based on the center of the substrate, between a maximum height of the composite surface shape and a minimum height of the composite surface shape is not less than 60 nanometers and does not exceed 90 nanometers.

10. The multi-layer reflective film coated substrate according to claim 9, wherein the surface shape of the multi-layer reflective film is an in-plane distribution of height from a first reference surface to a surface of the multi-layer reflective film, and
wherein the surface shape of the conductive film is an in-plane distribution of height from a second reference surface to a surface of the conductive film, and
wherein the composite surface shape obtained by composing a surface shape of the multi-layer reflective film and a surface shape of the conductive film is obtained by adding together the surface shape of the multi-layer reflective film and the surface shape of the conductive film.

11. The multi-layer reflective film coated substrate according to claim 9, comprising a thin film for transfer pattern formation on the multi-layer reflective film,
wherein the surface shape of the multi-layer reflective film is an in-plane distribution of height from a first reference surface to a surface of the thin film.

12. The multi-layer reflective film coated substrate according to claim 9, wherein the surface shape of the conductive film is an in-plane distribution of height from a second reference surface to a surface of the conductive film.

13. A mask blank comprising a thin film for transfer pattern formation on a first main surface of a substrate that has a second main surface opposite to the first main surface,
wherein, within a calculation region inside a circle 104 millimeters in diameter centered on the center of the substrate, a difference between a maximum height and a minimum height of a difference shape does not exceed 25 nanometers,
wherein the difference shape is a difference between:
a composite surface shape obtained by composing a surface shape of the thin film on the first main surface of the substrate and a surface shape of the second main surface of the substrate; and
a virtual surface shape defined by a Zernike polynomial expressed in a polar coordinate system,
wherein the Zernike polynomial is composed only of terms in which the order of variables related to a radius is second or lower order and includes at least one term in which the order of the variables related to a radius is second-order, and
wherein a difference, in an inner region of a square shape having a side of 132 millimeters based on the center of the substrate, between a maximum height of the composite surface shape and a minimum height of the composite surface shape is not less than 60 nanometers and does not exceed 90 nanometers.

14. The mask blank according to claim 13, wherein the surface shape of the thin film is an in-plane distribution of height from a first reference surface to a surface of the thin film, and
wherein the surface shape of the second main surface of the substrate is an in-plane distribution of height from a second reference surface to the second main surface of the substrate, and
wherein the composite surface shape obtained by composing a surface shape of the thin film and a surface shape of the second main surface of the substrate is obtained by adding together the surface shape of the thin film and the surface shape of the second main surface of the substrate.

15. The mask blank according to claim 13, comprising a multi-layer reflective film on the first main surface of the substrate,
wherein the surface shape of the thin film on the first main surface is an in-plane distribution of height from a first reference surface to a surface of the multi-layer reflective film.

16. The mask blank according to claim 13, comprising a conductive film on the second main surface of the substrate,
wherein the surface shape of the second main surface is an in-plane distribution of height from a second reference surface to a surface of the conductive film.

17. A mask blank comprising a thin film for transfer pattern formation on one of two opposite main surfaces of a substrate and a conductive film on the other of the two opposite main surfaces of the substrate,
wherein, within a calculation region inside a circle 104 millimeters in diameter centered on the center of the substrate, a difference between a maximum height and a minimum height of a difference shape does not exceed 25 nanometers,
wherein the difference shape is a difference between:
a composite surface shape obtained by composing a surface shape of the thin film and a surface shape of the conductive film; and a virtual surface shape defined by a Zernike polynomial expressed in a polar coordinate system, wherein the Zernike polynomial is composed only of terms in which the order of variables related to a radius is second or lower order and includes at least one term in which the order of the variables related to a radius is second-order, and wherein a difference, in an inner region of a square shape having a side of 132 millimeters based on the center of the substrate, between a maximum height of the composite surface shape and a minimum height of the composite surface shape is not less than 60 nanometers and does not exceed 90 nanometers.

18. The mask blank according to claim 17, wherein the surface shape of the thin film is an in-plane distribution of height from a first reference surface to a surface of the thin film, and wherein the surface shape of the conductive film is an in-plane distribution of height from a second reference surface to a surface of the conductive film, and wherein the composite surface shape obtained by composing a surface shape of the thin film and a surface shape of the conductive film is obtained by adding together the surface shape of the thin film and the surface shape of the conductive film.

19. The mask blank according to claim 17, wherein a multi-layer reflective film is provided between the one main surface and the thin film.

\* \* \* \* \*